United States Patent
Heo et al.

(10) Patent No.: US 9,508,955 B2
(45) Date of Patent: Nov. 29, 2016

(54) ORGANIC LIGHT EMITTING DISPLAY DEVICE

(71) Applicant: LG Display Co., Ltd., Seoul (KR)

(72) Inventors: JoonYoung Heo, Seoul (KR); YoungMi Kim, Incheon (KR); YongMin Park, Paju-si (KR); Yoonseob Jeong, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/983,341

(22) Filed: Dec. 29, 2015

(65) Prior Publication Data

US 2016/0315285 A1    Oct. 27, 2016

Related U.S. Application Data

(63) Continuation-in-part of application No. 14/866,653, filed on Sep. 25, 2015.

(30) Foreign Application Priority Data

Apr. 23, 2015  (KR) ................ 10-2015-0057471
Sep. 24, 2015  (KR) ................ 10-2015-0135682

(51) Int. Cl.
*H01L 51/44*  (2006.01)
*H01L 51/52*  (2006.01)
*H01L 51/50*  (2006.01)

(52) U.S. Cl.
CPC ......... *H01L 51/5259* (2013.01); *H01L 51/504* (2013.01); *H01L 51/5203* (2013.01); *H01L 51/5221* (2013.01); *H01L 2251/308* (2013.01)

(58) Field of Classification Search
CPC .................................. H01L 51/5221
USPC ....................................... 257/101
See application file for complete search history.

(56) References Cited

U.S. PATENT DOCUMENTS

| | | | | |
|---|---|---|---|---|
| 6,215,245 | B1 * | 4/2001 | Mori | H01L 51/5221 313/503 |
| 6,781,305 | B1 * | 8/2004 | Fujii | H01L 51/5221 313/503 |
| 2002/0176930 | A1 * | 11/2002 | Peng | C23C 14/027 427/58 |
| 2002/0187367 | A1 * | 12/2002 | Sakaguchi | H01L 51/5221 428/690 |

(Continued)

FOREIGN PATENT DOCUMENTS

JP    2007-173545 A    7/2007
JP     2007172545 A  *  7/2007

OTHER PUBLICATIONS

United States Office Action, U.S. Appl. No. 14/866,653, May 18, 2016, 7 pages.

*Primary Examiner* — George Fourson, III
(74) *Attorney, Agent, or Firm* — Fenwick & West LLP

(57) ABSTRACT

The present invention relates to an organic light emitting display device. An aspect of the present invention provides an organic light emitting display device comprising a first electrode on a substrate, an organic light emitting layer on the substrate, and a second electrode including at least two layers of which a composition of compensation materials is different on the organic light emitting layer. Another aspect of the present invention provides an organic light emitting display device in which a first electrode includes two or more layers having different compositions of compensation material such that thin and double compensation layers are formed on both surfaces of an organic light emitting layer.

19 Claims, 31 Drawing Sheets

(56) References Cited

U.S. PATENT DOCUMENTS

| | | | |
|---|---|---|---|
| 2006/0255722 A1* | 11/2006 | Imanishi | H01L 51/5206 313/504 |
| 2007/0181876 A1* | 8/2007 | Itai | H01L 51/5088 257/40 |
| 2007/0267973 A1* | 11/2007 | Suh | H01L 51/5221 313/512 |
| 2008/0122352 A1* | 5/2008 | Zhu | G02B 1/115 313/506 |
| 2008/0157068 A1* | 7/2008 | Lee | H01L 51/105 257/40 |
| 2010/0045176 A1* | 2/2010 | Kim | H01L 51/5234 313/504 |
| 2012/0298971 A1* | 11/2012 | Lee | H01L 51/0045 257/40 |
| 2016/0056409 A1* | 2/2016 | Nabatame | H01L 51/5206 257/40 |

* cited by examiner

FIG.2
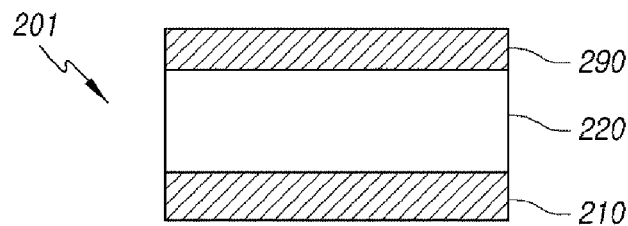
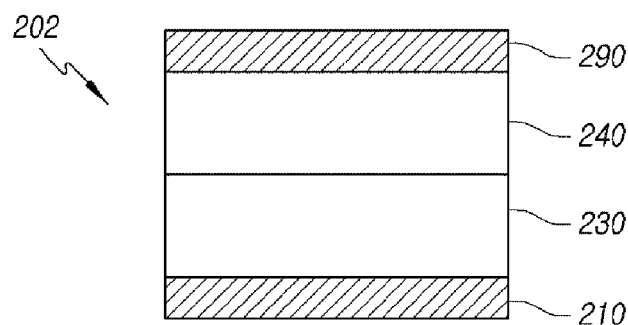
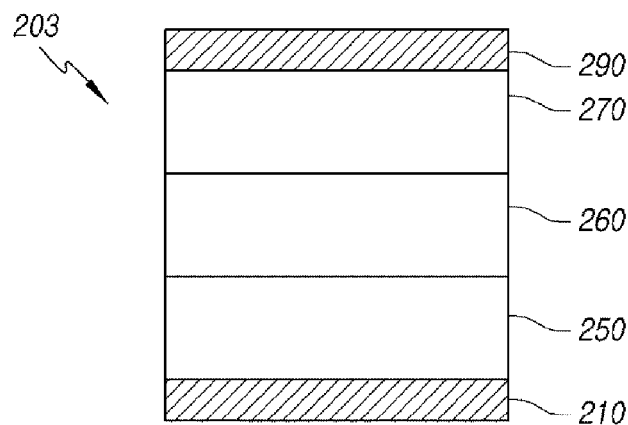

FIG.18
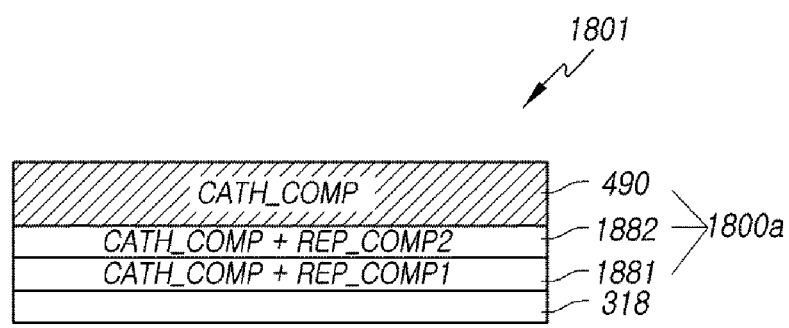
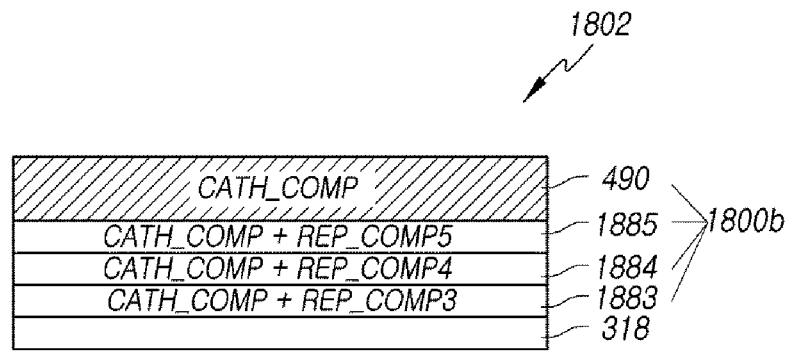

FIG.28

| CATH_COMP<br>AN_COMP | REP_COMP |
|---|---|
| SnO$_2$ | CO$_2$ |
|  | O$_2$ |
|  | O$_3$ |
|  | CH$_4$ |
| ITO | CH$_4$O |
|  | CCl$_4$ |
|  | NO |
| IZO | O$_2$ |
|  | O$_3$ |
|  | N$_2$ |
|  | H$_2$S |

FIG.29

| | THICK.(Å) | |
|---|---|---|
| | 200 | 500 |
| $O_2$ PARTIAL PRESSURE RATIO(%) | SHEET RESIST (Ω/□) | SHEET RESIST (Ω/□) |
| 9.1 | ~$10^8$ | ~$10^8$ |
| 10.8 | ~$10^9$ | ~$10^9$ |
| 13 | ~$10^{10}$ | ~$10^{10}$ |
| 16.7 | ~$10^{11}$ | ~$10^{11}$ |

ORGANIC LIGHT EMITTING DISPLAY DEVICE

CROSS-REFERENCE TO RELATED APPLICATIONS

This application is a continuation-in-part application of, and claims the benefit under 35 U.S.C. §120 from, co-pending U.S. patent application Ser. No. 14/866,653, entitled "Organic Light Emitting Display Device," filed on Sep. 25, 2015, which claims the benefit of Republic of Korea Patent Application No. 10-2015-0057471, filed on Apr. 23, 2015, and this application also claims the benefit of Republic of Korea Patent Application No. 10-2015-0135682 filed on Sep. 24, 2015, the subject matters of all of which are hereby incorporated by reference in their entirety.

BACKGROUND OF THE INVENTION

1. Field of the Invention

The present invention relates to an organic light emitting display device that includes a foreign body compensation layer.

2. Description of the Prior Art

With the development of an information-oriented society, the demands for various display devices for displaying images are increasing. Recently, various display devices, such as an LCD (Liquid Crystal Display), a PDP (Plasma Display Panel), an OLED (Organic Light Emitting Display Device), or an organic electro-luminescence display device, have been utilized. The various display devices include display panels corresponding thereto.

In the display panel, a thin film transistor is formed in each pixel area, and a specific pixel area is controlled through the current flow of the thin film transistor. The thin film transistor is comprised of a gate and a source/drain electrode.

The organic light emitting display includes a light-emitting layer that is formed between two different electrodes. When an electron created by one electrode and a hole created by the other electrode are injected into the light-emitting layer, the injected electron and the hole combine with each other to create an exciton. Then, the created exciton emits light while it transitions from the excited state to the ground state to thereby display images.

Meanwhile, a minute particle may enter into a display device during the process of manufacturing an organic light emitting display device, and such a particle is referred to as a foreign body. When the foreign body exists between electrodes, which should maintain an insulated state, a short may be generated between the electrodes, and the short may damage a specific pixel. Thus, in order to prevent a short due to a foreign body, a thick material may be spread. However, spreading the thick material may reduce the visibility of the organic light emitting display device. In addition, since an additional process is required, the cost may increase or the process efficiency may be reduced. Thus, a configuration capable of preventing a foreign body while maintaining the efficiency of the process, is necessary.

SUMMARY OF THE INVENTION

In this background, an aspect of the present invention is to prevent a defect due to a foreign body in an organic light emitting display device or a display panel.

Another aspect of the present invention is to include a layer compensating a foreign body, which is to prevent a short due to the foreign body being between a cathode and an anode when the cathode is formed thinly in order to increase the transmittance of the cathode in a top emission structure, under the cathode.

Another aspect of the present invention is to reduce the generation rate of a dark spot due to a short between a cathode and an anode, and thus increase the efficiency of a display panel.

Still another aspect of the present invention is to prevent a short due to the foreign body and to prevent a reduction of transmittance due to a compensation layer for compensating the foreign body included under a cathode.

According to an aspect of the present invention, an organic light emitting display device comprises a first electrode on a substrate, an organic light emitting layer on the substrate, and a second electrode including at least two layers, of which a composition of compensation materials is different on the organic light emitting layer.

According to another aspect of the present invention, an organic light emitting display device is provided such that a second electrode comprises a compensation layer and an electrode layer sequentially positioned from an organic light emitting layer, and a composition ratio of a compensation material included in a compensation layer is larger than that of a compensation material of a compensation material included in a second layer.

According to another aspect of the present invention, an organic light emitting display device is provided such that a second electrode comprises a compensation layer, and a first electrode comprises an electrode layer and a compensation layer sequentially positioned from a substrate, a composition ratio of a compensation material of the compensation layer being larger than that of a compensation material of the electrode layer.

According to an aspect of the present invention, an organic light emitting device comprises a substrate, a first electrode on the substrate, an organic light emitting layer on the first electrode, and a second electrode of which compositions of a compensation material are different at a first interface close to the organic light emitting layer and at a second interface opposite to the first interface.

According to another aspect of the present invention, an organic light emitting device is provided such that the composition ratio of the compensation material in a second electrode is the highest at the first interface and the composition ratio of the compensation material in the second electrode is the lowest at the second interface.

As described above, according to the present invention, an organic light emitting display device, in which a compensation layer for compensating a foreign body is included, may be implemented. In addition, a compensation layer may be deposited by differentiating the composition ratio or the composition of a gas including a compensation material that forms the compensation layer during the process of forming a second electrode, such as a cathode.

According to the present invention, a short between a cathode and an anode caused by a foreign body may be prevented by a second electrode including a compensation layer and an electrode layer. In addition, a compensation layer securing a transmittance of a second electrode is formed and thus the light efficiency of an organic light emitting display device may increase.

According to the present invention, a compensation of a second electrode can be thinned by including a first electrode including a compensation layer and a electrode layer, and thus the light efficiency of an organic light emitting display device may further increase.

According to the present invention, during the forming of a layer for compensating a foreign body, since only a partial pressure ratio of a compensation material, such as oxygen and ozone, may be controlled during the forming of a second electrode such as a cathode or a first electrode such as a anode without an additional device, the process efficiency may be increased and the process cost may be reduced.

BRIEF DESCRIPTION OF THE DRAWINGS

The above and other objects, features, and advantages of the present invention will be more apparent from the following detailed description taken in conjunction with the accompanying drawings, in which:

FIG. 2 is a view illustrating the structure of an organic light emitting layer, a first electrode and a second electrode, to which the present invention may be applied;

FIG. 18 is a cross-sectional view of a display panel according to a third embodiment of the present invention;

FIG. 28 is a chart illustrating a relation between a Cath_Comp, which is a material forming the second electrode, and an Rep_Comp, which is a material sputtered to form the compensation layer;

FIG. 29 is a chart illustrating an increase of a sheet resistance according to a partial pressure ratio of the Rep_Comp, according to an embodiment of the present invention;

DETAILED DESCRIPTION OF THE EXEMPLARY EMBODIMENTS

Figure 1:
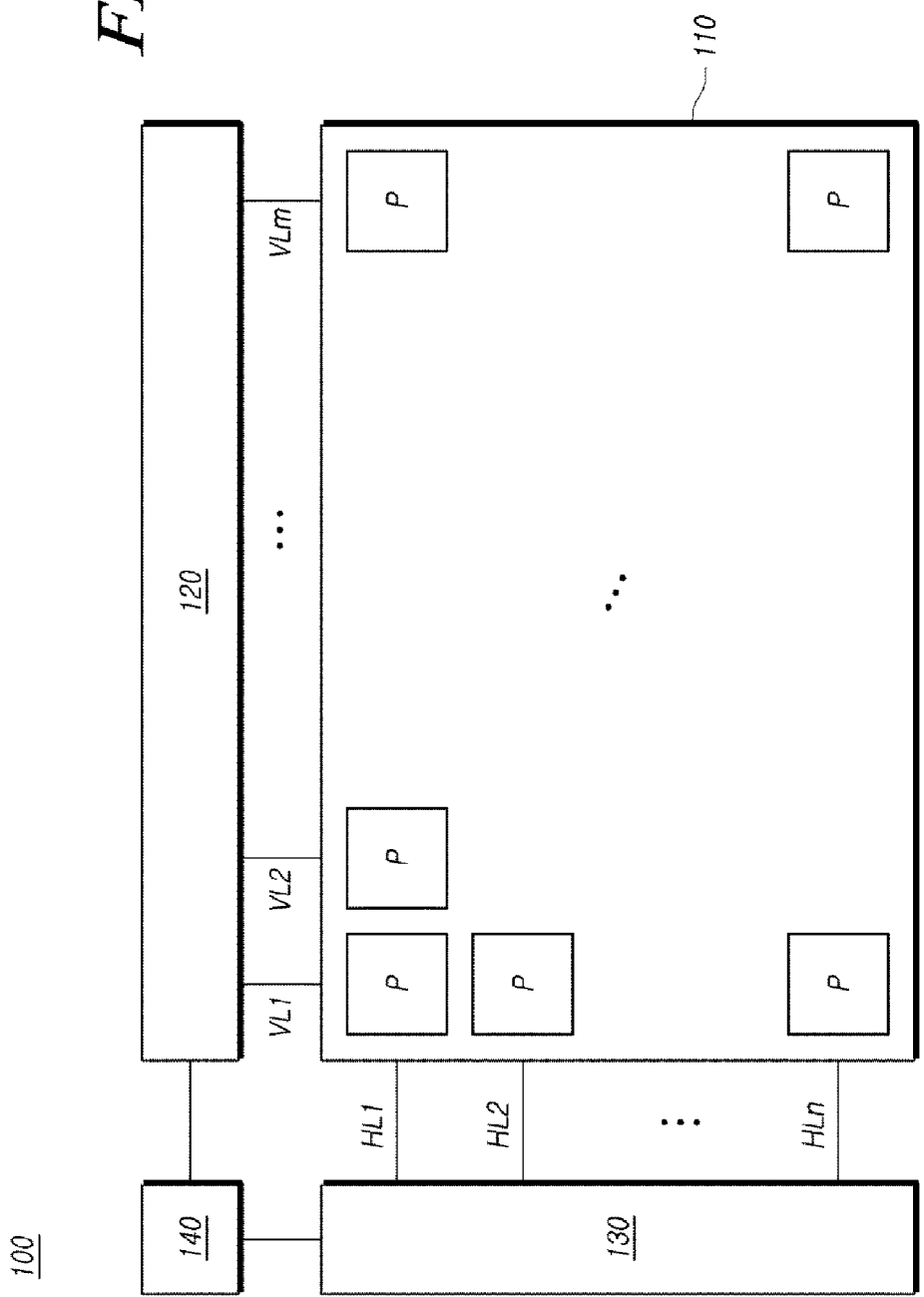
FIG. 1 is a schematic view illustrating a display device according to embodiments of the present invention.

Hereinafter, embodiments of the present invention will be described with reference to the accompanying drawings. In designating elements of the drawings by reference numerals, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a schematic view illustrating a display device according embodiments of the present invention.

Referring to FIG. 1, the display device 100 according to embodiments includes a display panel 110 in which a plurality of first lines VL1 to VLm are formed in a first direction (for example, a vertical direction) and a plurality of second lines HL1 to HLn are formed in a second direction (for example, a horizontal direction), a first driving unit 120 for supplying a first signal to the plurality of first lines VL1 to VLm, a second driving unit 130 for supplying a second signal to the plurality of second lines HL1 to HLn, and a timing controller 140 for controlling the first driving unit 120 and the second driving unit 130.

A plurality of pixels P are defined in the display panel 110 as the plurality of first lines VL1 to VLm formed in the first direction (for example, a vertical direction) and the plurality of second lines HL1 to HLn formed in the second direction (for example, a horizontal direction) cross each other.

Each of the above-mentioned first driving unit 120 and second driving unit 130 may include at least one driving integrated circuit outputting a signal for an image display.

The plurality of first lines VL1 to VLm formed in the display panel 110 in the first direction may be, for example, data lines formed in the vertical direction (first direction), for transferring a data voltage (first signal) to vertical columns of pixels, and the first driving unit 120 may be a data driving unit for supplying a data voltage to the data lines.

In addition, the plurality of second lines HL1 to HLn formed in the display panel 110 in the second direction may be gate lines formed in the horizontal direction (second direction), for transferring a scan signal (first signal) to horizontal rows of pixels, and the second driving unit 130 may be a gate driving unit for supplying a scan signal to the gate lines.

In addition, a pad part is configured in a display panel 110 in order to access the first driving unit 120 and the second driving unit 130. The pad part transfers the first signal to the display panel 110 when the first driving unit 120 provides the first signal to the plurality of first lines VL1 to VLm. In the same manner, the pad part transfers the second signal to the display panel 110 when the second driving unit 130 provides the second signal to the plurality of second lines HL1 to HLn.

Each pixel includes at least one subpixel. The subpixel means a unit in which one type of a specific color filter may be formed, or a unit in which a color filter is not formed and an organic light emitting device emits a specific color. A color defined in the subpixel may include a red, a green and a blue, and may selectively include a white color. However, the present invention is not limited thereto. Since each subpixel includes an additional thin film transistor and an electrode connected to the thin film transistor, hereinafter the subpixel forming a pixel is referred to as one pixel area.

An electrode connected to a thin film transistor controlling a light emission of each pixel area in a display panel is referred to as a first electrode. An electrode disposed on a front surface of the display panel or disposed so as to include two or more pixel areas is referred to as a second electrode. When the first electrode is an anode electrode, the second electrode is a cathode electrode, and the inverse case is possible. Hereinafter, the present specification is described based on an anode electrode as an embodiment of the first electrode and a cathode electrode as an embodiment of the second electrode, but the present invention is not limited thereto.

Meanwhile, an organic light emitting display device includes a top emission, a bottom emission, a dual emission and the like. Although any emission type is selected, an area where a process should be progressed becomes wider in a large area display panel of which an area of a display panel increases, and thus the possibility of the entrance of a foreign body is increased. Specially, when the foreign body enters into an area between the first electrode and the second electrode, where a short should not be generated in a process, a short may be generated, and thus a corresponding pixel area may be operated as a dark spot.

FIG. 2 is a view illustrating the structure of an organic light emitting layer, a first electrode and a second electrode, to which the present invention may be applied. The organic light emitting layer is positioned between the first electrode 210 and the second electrode 290. The display panel may have one organic light emitting layer as shown by a reference numeral 201, may have two organic light emitting layers as shown by a reference numeral 202, and may have three organic light emitting layers as shown by a reference numeral 203.

In the case of the reference numeral 201, an organic light emitting layer 220 emits white light.

In the case of the reference numeral 202, a first light emitting layer 230 may emit blue light, and a second organic light emitting layer 240 may emit any of green light or yellow-green light.

In the case of the reference numeral 203, a first light emitting layer 250 may emit blue light, a second organic light emitting layer 260 may emit any of green light or yellow-green light, and a third light emitting layer 270 may emit both of red light and blue light.

A specific color dopant may be doped in a configuration of FIG. 2 in order to emit a specific color.

Compositions of various colors of the light emitting layers in the reference numerals 201, 202 and 203 may be selected variously according to an embodiment of the present invention, and the present invention is not limited thereto.

In the configuration of FIG. 2, the first electrode 210 may be Indium Tin Oxide (ITO), Indium Zinc Oxide (IZO), IGZO, $SnO_2$, ZnO and the like as a transparent conductive material of which the conductivity and work function are high. In addition, when the first electrode 210 includes a metal of which a work function is low, the first electrode 210 may be Al, Ag, Mg, Li, Ca and the like, but is not limited thereto. The second electrode 290 may be the above-mentioned ITO, IZO, IGZO, $SnO_2$, ZnO and the like which are transparent conductive materials having a high work function. In addition, when the second electrode 290 includes a metal of which a work function is low, the second electrode 290 may be Al, Ag, Mg, Li, Ca and the like, but is not limited thereto.

Figure 3:
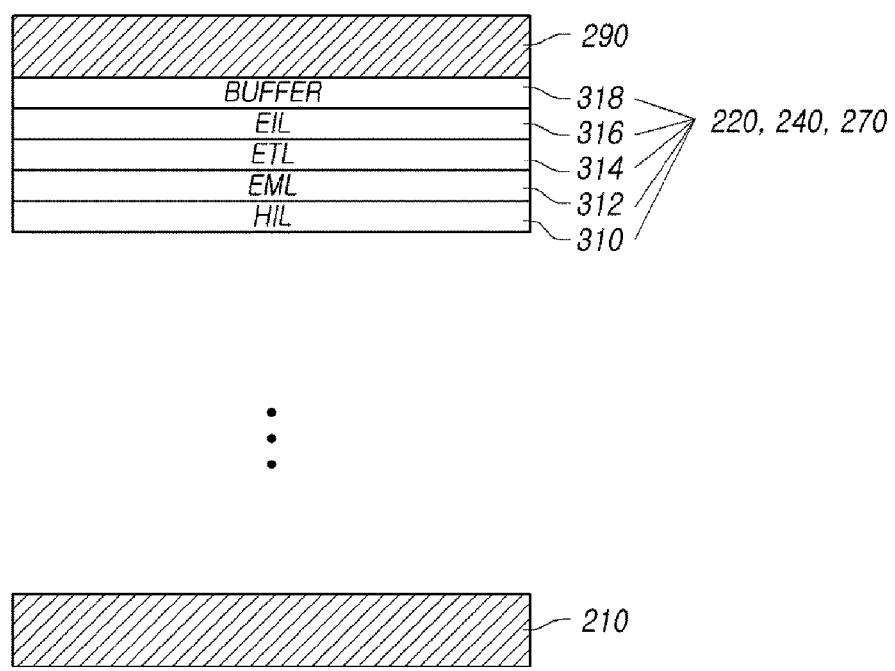
FIG. 3 is a view illustrating a configuration below the second electrode in a configuration of FIG. 2 in more detail.

FIG. 3 is a view illustrating a configuration below the second electrode in the configuration of FIG. 2 in more detail.

The above-mentioned organic light emitting layer may be divided into an EMitting Layer (EML), an Electron Injection Layer (EIL), an Electron Transport Layer (ETL), an Hole Transport Layer (HTL), a Hole Injection Layer (HIL) and the like. In addition, when two or more EMLs are included in the organic light emitting layer, a Charge Generation Layer (CGL) may be positioned, and the CGL plays a role of controlling a charge between two upper and lower organic light emitting layers to balance.

Meanwhile, the configuration of the light emitting layers 220, 240 and 270 below the second electrode includes a buffer 318, the EIL 316, the ETL 314, a specific color of EML 312 and the HIL 310.

In FIGS. 2 and 3, when a foreign body enters into an area between the first electrode 210 and the second electrode 290 and thus a short is generated between the first electrode 210 and the second electrode 290 due to the foreign body, a corresponding pixel does not light. In order to prevent this, when the area between the first electrode 210 and the second electrode 290 is formed thickly, for example a thickness of the buffer layer 318 is increased, a problem arises in which light efficiency is reduced.

Hereinafter, in the present specification, an organic light emitting layer including a compensation layer compensating a foreign body below the second electrode is described. Especially, the compensation layer may make the composition ratio or the composition amount of a gas included in a compensation material that forms the compensation layer different during the process of forming the second electrode such that an additional process is not required.

A composition component may be different according to the distance from the second electrode, according to an embodiment of the present invention to the buffer layer. More specifically, the second electrode may be divided into an electrode layer and a compensation layer. As another embodiment, the second electrode may be formed such that the composition material of the second electrode at an interface adjacent to the buffer layer is different from the composition material of the second electrode at an interface far from the buffer layer. To this end, the compensation material is included in the present invention, a high resistance area is formed in a lower portion of the second electrode, which is an area close to the buffer layer, and a low resistance area is formed in an upper portion of the second area, which is an area far from the buffer layer. Therefore, the high resistance area functions as the compensation layer compensating the foreign body, and the low resistance area functions as the electrode layer receiving a base power.

Figure 4:
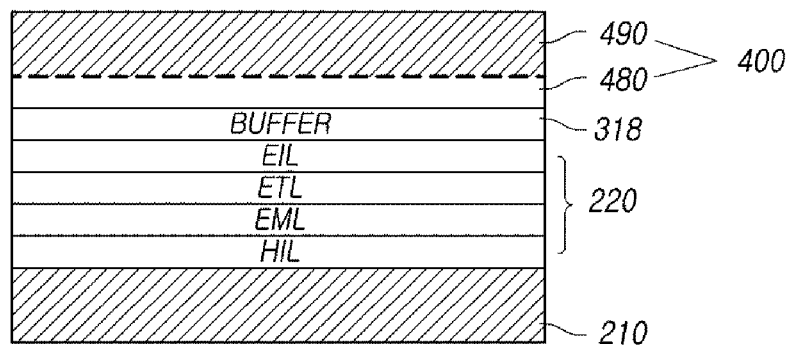
FIGS. 4 to 6 are views illustrating a cross-section of a display panel in which a second electrode including a foreign body compensation layer, according to an embodiment of the present invention, is positioned.
Figure 5:
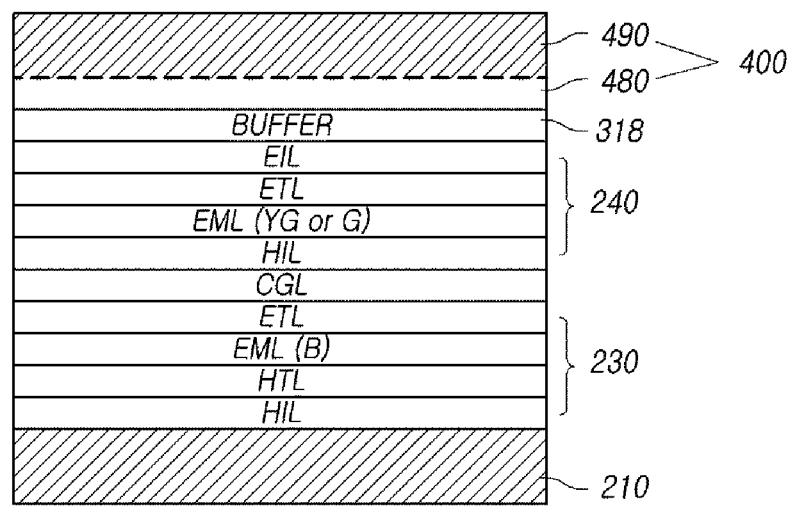
Figure 6:
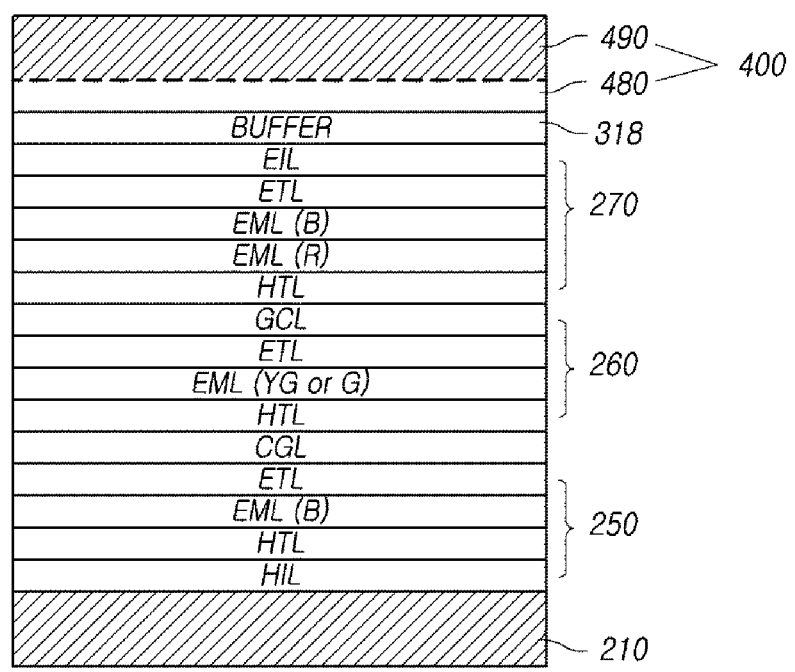

FIGS. 4 to 6 are views illustrating a cross-section of a display panel in which a second electrode including a foreign body compensation layer, according to an embodiment of the present invention, is positioned. A configuration of FIG. 4 may be applied to the reference numeral 201 of FIG. 2. A configuration of FIG. 5 may be applied to the reference numeral 202 of FIG. 2. A configuration of FIG. 6 may be applied to the reference numeral 203 of FIG. 2.

In FIGS. 4 to 6, each layer is segmentalized and shown. The above-mentioned organic light emitting layer may include the ETL, the EML, and HTL, and may selectively include the EIL and the HIL according to the position of the first electrode 210 and a second electrode 490. In addition, the CGL may be located between the organic light emitting layers.

In FIGS. 4 to 6, the cases in which the number of the organic light emitting layers is one, two, or three are shown as an embodiment, but the present invention is not limited thereto. In FIG. 5, a first emitting layer 240 may emit yellow-green light or green light, the second light emitting layer 230 may emit blue light, and may emit white light by combining these colors. In even FIG. 6, the white light may be emitted by combining colors of three types of light emitting layers 250, 260, and 270. In the configuration of FIGS. 4 to 6, the second electrode is divided into two layers, including the compensation layer. In addition, the second electrode includes the compensation layer that prevents a cathode-anode short due to a foreign body even in a case in which the second electrode should be spread thinly. In addition, in order to increase the light emission efficiency of the white light, a compensation layer securing a transmittance of the second electrode is formed in the present invention to increase a light efficiency, instead of a compensation layer, of which a transmittance is low, is formed below the second electrode.

In FIGS. 4 to 6, a second electrode 400 is divided into an electrode layer 490 and a compensation layer 480. The two above-mentioned layers may be differentiated according to a composition ratio of a compensation material forming the compensation layer. Thus, an interface between the two layers may not be clear. That is, in the second electrode 400, the electrode layer 490 and the compensation layer 480 may not be differentiated by an accurate interface. However, the second electrode 400 may include a high resistance area and a low resistance area which are two areas, in which the high resistance area, where the distribution of a compensation material is high, may function as the compensation layer 480 compensating the foreign body, and the low resistance area, where the distribution of the compensation material is low, may function as the electrode layer 490 receiving power.

In FIGS. 4 to 6, the compensation layer 480 may be formed by controlling an injection amount of a compensation gas during the process of forming the second electrode 400. For example, the compensation material which forms the compensation layer 480 while sputtering a material forming the second electrode 400 is plentifully injected initially, and then the injection amount may be reduced gradually. Accordingly, the compensation layer 480 of the high resistance area is formed in the area adjacent to the buffer layer 318. In addition, after the injection amount of the compensation material is reduced, the electrode layer 490 may be formed on the compensation layer 480. The above-mentioned compensation material may be combined with an electrode material forming the electrode layer 490. In addition, the above-mentioned compensation material may be a material for increasing the resistance of the electrode layer 490, as an embodiment.

The second electrode 400 may include the electrode material and the compensation material, which are two types of materials. Of course, each material may be a compound of another material. In the second electrode 400, the ratio between the electrode material and the compensation material in the compensation layer or the high resistance area 480 is different from the ratio between the electrode material and the compensation material in the electrode layer or the low resistance area 490.

Hereinafter, for the convenience of description, the electrode material is indicated as "Cath_Comp", and the compensation material is indicated as "Rep_Comp". A configuration of "Rep_Comp" forming the compensation layer 480 and the electrode layer 490 may increase as the configuration of "Rep_Comp" is close to an upper interface of the second electrode 400. Alternatively, a composition ratio of "Rep_Comp" may be clearly distinguished in the compensation layer 480 and the electrode layer 490.

The Cath_Comp, which is the electrode material, may be $SnO_2$, ITO, IZO, IGZO and the like, but is not limited thereto. In addition, when at least two types of materials are used, in order to distinguish these, a sequential number may be added like Cath_Comp1, Cath_Comp2, Cath_Comp3 and the like.

The Rep_Comp, which is the compensation material, is combined with a conductive material and thus has a property of a high resistance. The Rep_Comp may be $O_2$, $O_3$, $CO_2$, $CH_4$, $CH_4O$, $CCl_4$, NO, $N_2$, $H_2S$ and the like as an embodiment, but is not limited thereto. In addition, if two or more materials are used, in order to distinguish these, a sequential number may be added like Rep_Comp1, Rep_Comp2, Rep_Comp3 and the like.

In addition, when two or more materials are combined in a process such as a sputtering, corresponding materials may be written in parallel. For example, if Cath_Comp and Rep_Comp are two materials that are deposited in a process such as sputtering, the combination of Cath_Comp and Rep_Comp is indicated as Cath_Comp+Rep_Comp. When a composition ratio of each material is determined, the composition ratio may be written in parallel using a parenthesis like Cath_Comp (90%)+Rep_Comp (10%).

An example in which the compensation layer 480 and the electrode layer 490 are differentiated is described as a first embodiment of the present invention. The compensation layer 480 may include two or more different layers according to the distribution or the composition ratio of the compensation material.

FIGS. 7 to 10 are cross-sectional views of a display panel according to the first embodiment of the present invention. For the convenience of description, the EIL to first electrode 210 below the buffer layer 318 is not shown.

Figure 7:
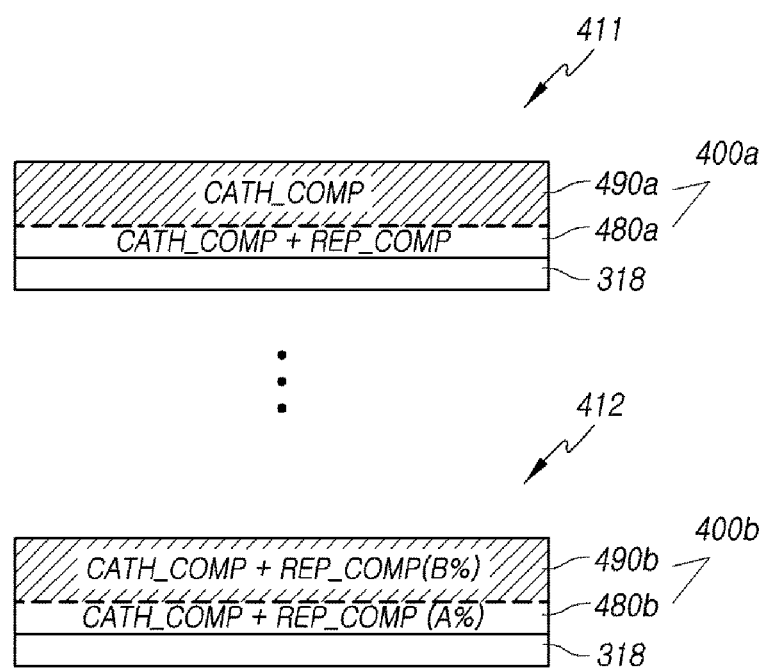
FIGS. 7 to 10 are cross-sectional views of a display panel according to the first embodiment of the present invention.

FIG. 7 illustrates a configuration 411 in which a compensation material is not included in the electrode layer 490a according to the first embodiment of the present invention, and a configuration 412 in which the composition ratios of the compensation material in the compensation layer and the electrode layer are different.

In FIG. 7, one Cath_Comp may be deposited during a sputtering method in a process of forming second electrodes 400a and 400b. The Cath_Comp and the Rep_Comp are sputtered, and compensation layers 480a and 480b are formed in a state in which the partial pressure ratio of the Rep_Comp is increased, and then the partial pressure ratio of the Rep_Comp is reduced. Alternatively, only the Cath_Comp may be sputtered to be deposited rather than sputtering the Rep_Comp. However, even in a case in which only the Cath_Comp is deposited to form the electrode layer 490a, the Rep_Comp may be included in the electrode layer 490b as shown by a reference numeral 412, due to a small amount of Rep_Comp maintained in a chamber. A reference numeral 411 illustrates a case in which a Rep_Comp, which is the compensation material, is not included in the electrode layer 490a.

As an embodiment of a reference numeral 412, when the Cath_Comp is IZO and Rep_Comp is $O_2$, a partial pressure ratio of $O_2$ may be increased in order to form the compensation layer 480b which is InZnOy. In addition, the electrode layer 490b may be formed with InZnOx. Here, a relation of "x<y" is formed. The InZnOx forms a low resistance film and thus becomes the electrode layer since the partial pressure ratio of $O_2$ or $O_3$ is low in a sputtering process. The InZnOy forms a high resistance film and thus becomes the compensation layer since the partial pressure ratio of $O_2$ or $O_3$ is high in the sputtering process. The "x" may have a value of one to 2, and the "y" may have a value of two to three. Here, as an embodiment, after the compensation layer 480b is formed in a state (e.g., 16%) in which a partial pressure of $O_2$ is increased in a ratio of Ar and $O_2$, the electrode layer 490b is formed in a state (e.g., 9%) in which a partial pressure of $O_2$ is reduced in the ratio of Ar and $O_2$. Thus, a ratio (e.g., a %) of $O_2$ forming the compensation layer 480b is higher than a ratio (e.g., B %) of $O_2$ forming the electrode layer 490b.

The partial pressure ratio means the ratio of the Rep_Comp among various gases in the chamber in the sputtering process, and this ratio is not absolutely equal to the composition ratio of the Rep_Comp in the compensation layer 480b. However, since the higher the partial pressure ratio the higher the composition ratio of the Rep_Comp, the sputtering process may be performed such that the partial pressure ratio of the Rep_Comp in the compensation layer is higher than the partial pressure ratio of the Rep_Comp in the electrode layer.

Figure 8:
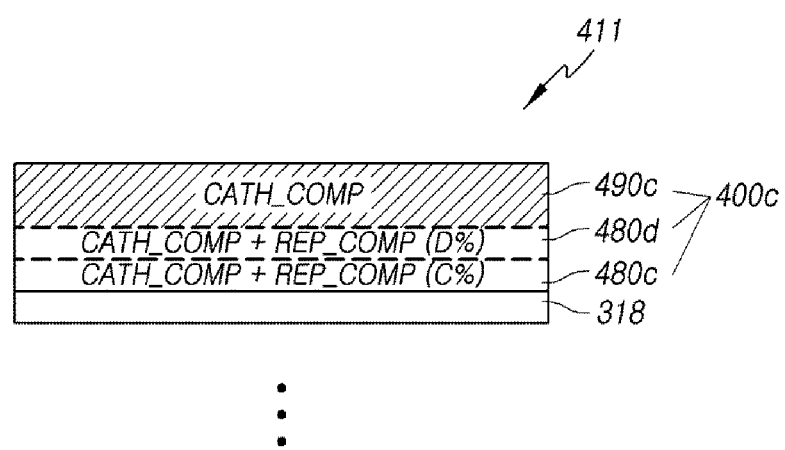

FIG. 8 illustrates a configuration in which the compensation layer according to the first embodiment of the present invention is included, and here, the compensation layer includes two layers of which a composition ratio of Rep_Comp is different.

The Cath_Comp is deposited on the buffer 318, the Rep_Comp is deposited in a regular partial pressure ratio. The first compensation layer 480c, in which the Rep_Comp forms C %, is formed. The Rep_Comp is disposed on the first compensation layer 480c in a reduced partial pressure ratio to form the second compensation layer 480d in which the Rep_Comp forms D %. Next, the Rep_Comp is not sputtered and only the Cath_Comp is deposited.

In FIG. 8, the first compensation layer 480c and the second compensation layer 480d includes the same Rep_Comp, the partial pressure ratio is differentiated in a deposition process, the composition ratio of the Rep_Comp of the first compensation layer 480c becomes C %, the composition ratio of the Rep_Comp of the second compensation layer 480d becomes D %, and thus the first compensation layer 480c and the second compensation layer 480d have a relation of "C>D".

Figure 9:
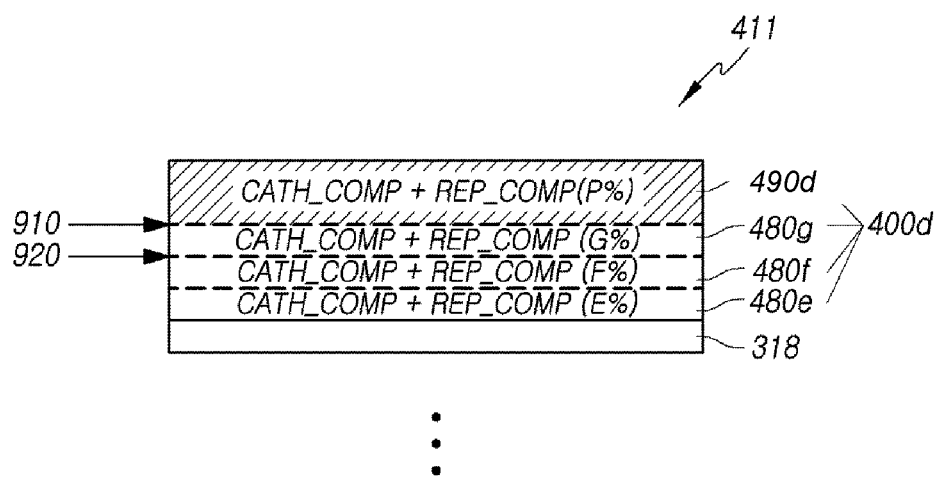

FIG. 9 illustrates a configuration in which the compensation layer according to the first embodiment of the present invention includes three layers of which the composition ratio of the Rep_Comp are different. Identically to FIGS. 7 and 8, the Cath_Comp is deposited on the buffer 318. A first compensation layer 480e is formed by reducing the partial pressure ratio of Rep_Comp to three steps to deposit the Rep_Comp. A second compensation layer 480f is formed by reducing the partial pressure ratio of the Rep_Comp and depositing the Rep_Comp on the first compensation layer 480e. A third compensation layer 480g is formed on the second compensation layer 480f by reducing the partial pressure ratio of the Rep_Comp. Next, the Rep_Comp is not sputtered and only the Cath_Comp is deposited. A process may progress such that the partial pressure ratio is reduced as the Rep_Comp is close to the electrode layer 490d, and a relation of the composition ratios of the Rep_Comps in each compensation layer may have a relation of "E>F>G".

Meanwhile, since the Rep_Comp may be left in the chamber although the Rep_Comp is not sputtered, a material forming the electrode layer 490d may be Cath_Comp+Rep_Comp (P %). In this case, p may be smaller than G. As an embodiment, E, F, G and P may have a relation of "P<<G<F<E".

Since different compensation materials form the second electrode 400 in various layers in FIGS. 7 to 9, a cathode-anode short due to a foreign body entered from the outside is prevented in the compensation layer 480 of the high resistance area where the compensation materials are contained plentifully, and thus the probability of a dark spot is blocked.

A showing of an interface between the compensation layer and the electrode layer or an interface between the compensation layers as a dotted line in FIGS. 4 to 9 is for showing that the composition ratio of the Rep_Comp which is the compensation material may be gradually changed at front and rear areas of these interfaces. A distribution of a compensation material at two interfaces 910 and 920 is described with reference to FIG. 10.

Figure 10:
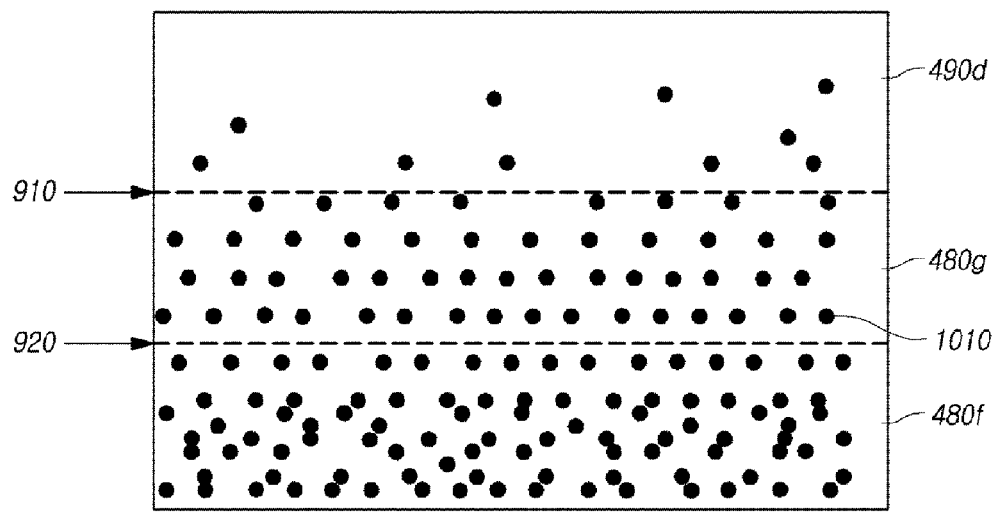

In FIG. 10, a Ref_Comp 1010 of a second compensation layer 480f is formed of a very high density, that is F %. Meanwhile, a composition ratio of the Ref_Comp 1010 in a third compensation layer 480g is G % which is lower than a composition ratio of the Ref_Comp 1010 in the second compensation layer 480f. In addition, a composition ratio of the Ref_Comp 1010 in an electrode layer 490d is P % which is a very low ratio. Here, the composition density of the Ref_Comp 1010 may be different based on the interfaces 910 and 920, but the composition density may not be clearly distinguished and may be gradually reduced. This is because the composition ratio of the Ref_Comp may have an error due to the Ref_Comp left in the chamber even in a case in which the Ref_Comp is not deposited any more in the chamber performing the sputtering process. The present invention is applied to all embodiments such as an embodiment of a compensation material compensating a foreign body between an interface adjacent to a buffer layer and an interface far from the buffer layer based on two interfaces of the second electrode, for example a material forming a high resistance film is reduced gradually or in a step type.

Figure 11:
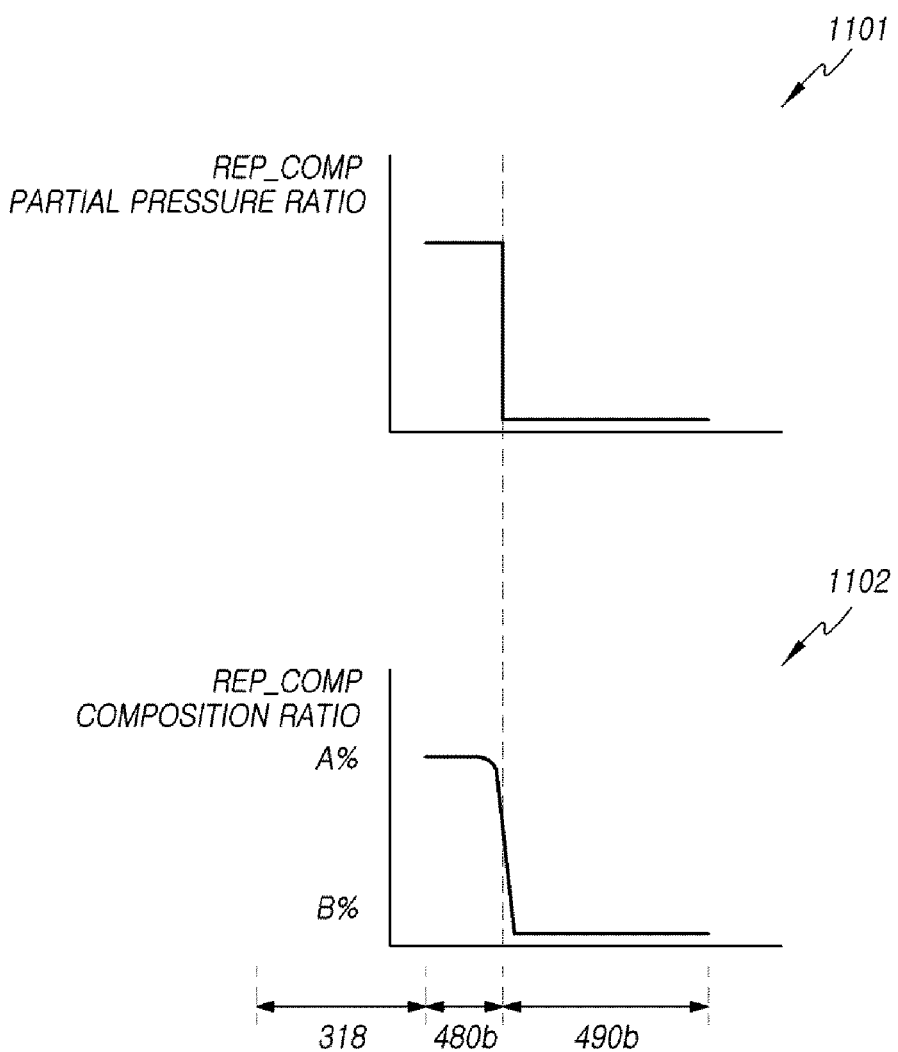
FIGS. 11 to 13 are views illustrating a partial pressure ratio of a compensation material for forming a second electrode shown in FIGS. 7 to 9 and a composition ratio of the compensation material in the second electrode due to the partial pressure ratio.
Figure 12:
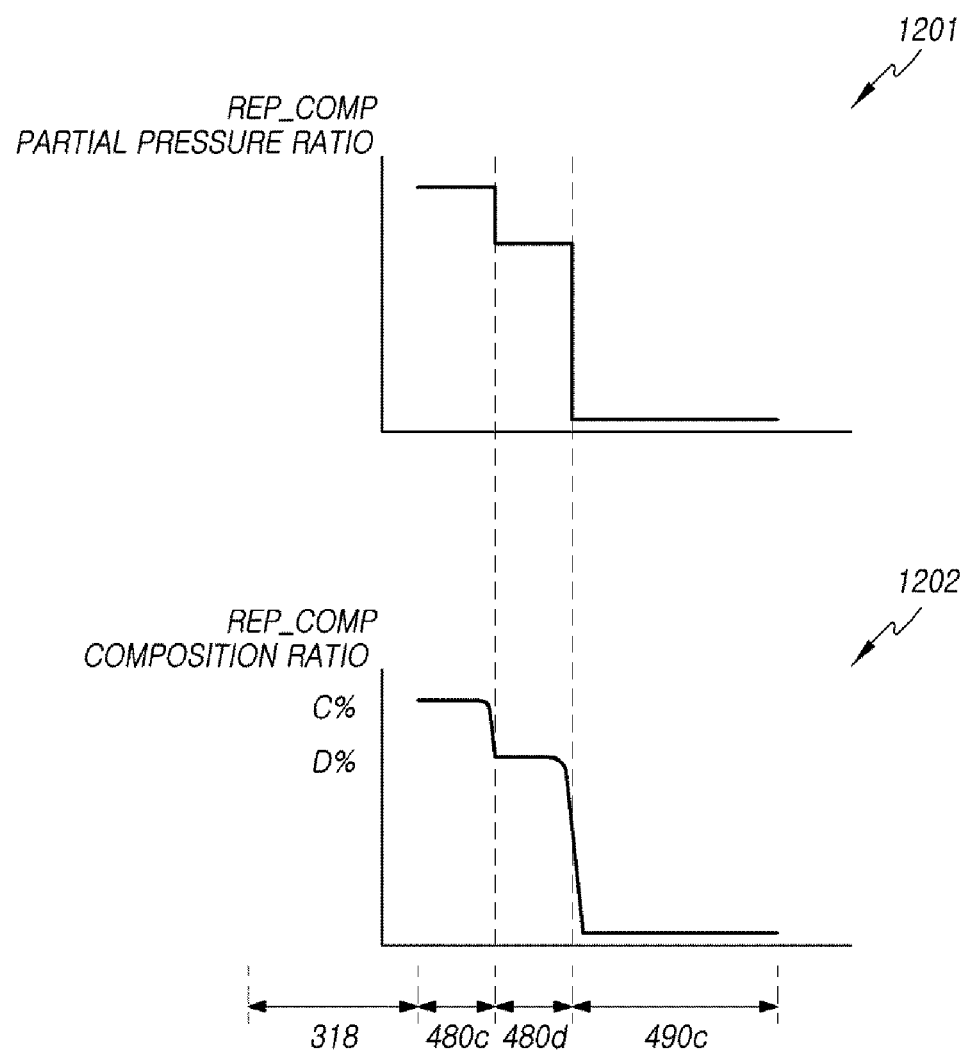
Figure 13:
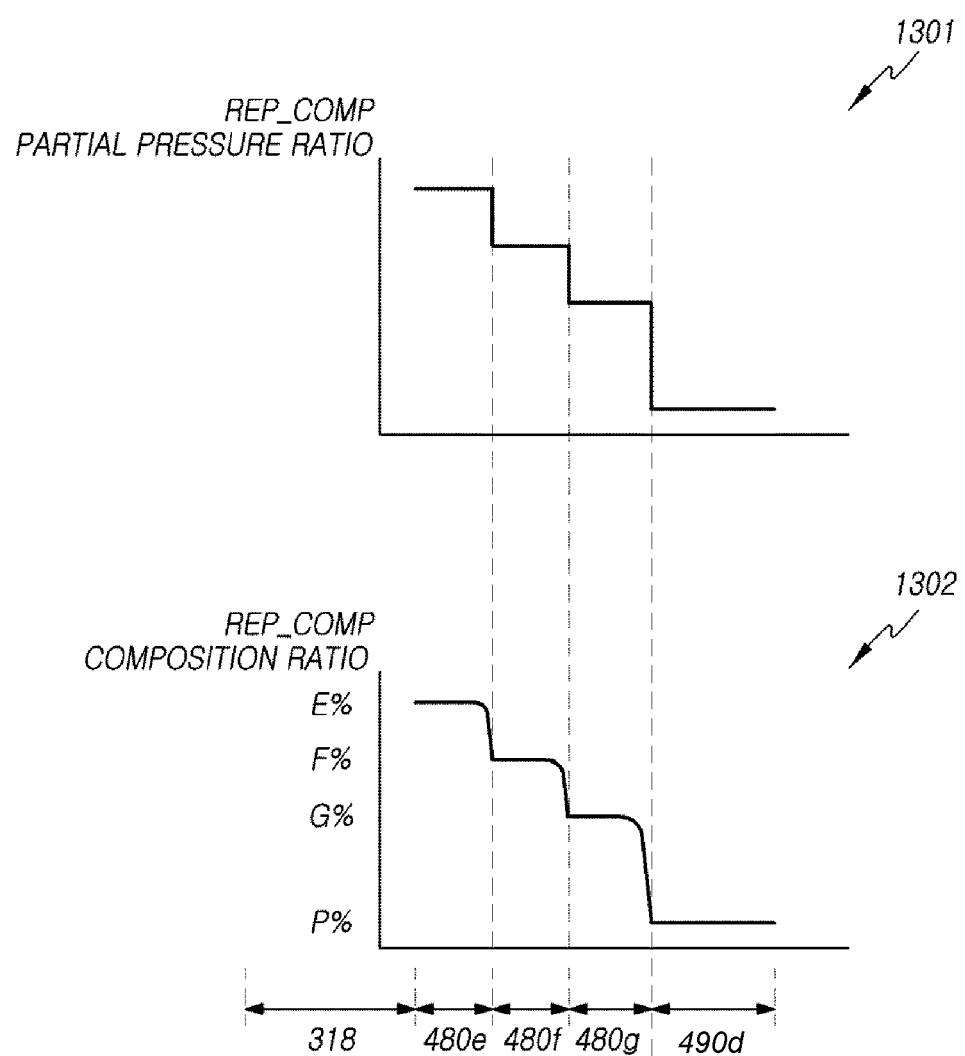

FIGS. 11 to 13 are views illustrating a partial pressure ratio of a compensation material for forming the second electrode shown in FIGS. 7 to 9 and a composition ratio of the compensation material in the second electrode due to the partial pressure ratio.

A reference numeral 1101 of FIG. 11 is a partial pressure ratio of the Rep_Comp in a process of forming the second electrode 400b equal to the reference numeral 412 of FIG. 7. A reference numeral 1102 illustrates a composition ratio of the Rep_Comp in the second electrode 400b formed in a partial pressure ratio equal to that of the reference numeral 1101. In the reference numeral 1102, the composition ratio of the Rep_Comp is rapidly reduced at an interface between the compensation layer 480b and the electrode layer 490b in the second electrode 400b. The compensation layer 480b is formed between an interface making contact with the buffer layer 318 and an interface making contact with the second electrode 490b. After forming of the buffer layer 318, a Cath_Comp material forming the second electrode 490b is sputtered, and the Rep_Comp which is a material for forming the compensation layer 480b may be sputtered in the sputtering process of the Cath_Comp material.

A reference numeral 1201 of FIG. 12 is a partial pressure ratio of the Rep_Comp during a process of forming the second electrode 400c as shown in FIG. 8. A reference numeral 1202 illustrates a composition ratio of the Rep_Comp in the second electrode 400c formed in a partial pressure ratio equal to that of the reference numeral 1201. In the reference numeral 1202, the composition ratio of the Rep_Comp is rapidly reduced at an interface between the first compensation layer 480c and the second compensation layer 480d, and an interface between the second compensation layer 480d and the electrode layer 490c in the second electrode 400c.

A reference numeral 1301 of FIG. 13 is a partial pressure ratio of the Rep_Comp during a process of forming the second electrode 400d as shown in FIG. 9. A reference numeral 1302 illustrates a composition ratio of the Rep_Comp in the second electrode 400d formed in a partial pressure ratio equal to that of the reference numeral 1301. In the reference numeral 1302, the composition ratio of the Rep_Comp is rapidly reduced at an interface between the first compensation layer 480e and the second compensation layer 480f, and an interface between the second compensation layer 480f and the electrode layer 490d in the second electrode 400d.

After the buffer layer 318 is formed, the Rep_Comp and the Cath_Comp are sputtered, the Rep_Comp is deposited by reducing the partial pressure ratio in stages as shown by the reference numeral 1301 to form the first, second, and third compensation layers 480e, 480f, and 480g. Meanwhile, even though only the Cath_Comp is sputtered to form the electrode layer 490d, the leftover Rep_Comp may be included in the electrode layer 490d. Accordingly, a very small amount of, for example, P % of Rep_Comp may also be left in the second electrode 490d.

The partial pressure ratio distributed in the compensation layer and the electrode layer corresponds to the reference numerals 1101, 1201 and 1301 in FIGS. 11 to 13. Thus, a distribution (or composition ratio) of the Rep_Comp which is a material forming the compensation layer is high in an area of the compensation layers 480b, 480c, 480d, 480e, 480f and 480g, and the distribution (or composition ratio) of the Rep_Comp is low in the electrode layers 490b, 490c and 490d.

As described above, according to the present invention, since the compensation layer may not be separately formed and a material forming the compensation layer may be selectively input, a display panel and a display device capable of simplifying a process and capable of compensating a foreign body without an additional material or process and an investment of an equipment may be produced. In addition, a rate of defect in which a dark spot is generated due to a foreign body may be reduced by a foreign body compensation layer and thus quality of a display panel may be improved.

As a second embodiment of the present invention, an example in which the distribution or the composition ratio of the compensation material is gradually reduced in the compensation layer and the electrode layer is presented. In the above-mentioned first embodiment, the partial pressure ratio of the Rep_Comp which is the compensation material is controlled in stages in the sputtering process. Therefore, in the second embodiment, an interface at which a composition ratio of a compound forming the compensation layer and the electrode layer has a rapid difference is not formed, and instead the Rep_Comp is gradually reduced. Thus, according to the second embodiment, the second electrode is formed rather than a separately distinguished compensation layer. The second electrode may be formed such that the composition ratio of the Rep_Comp is high at the interface close to the buffer layer and the composition ratio of the Rep_Comp is low at the opposite interface.

Figure 14:
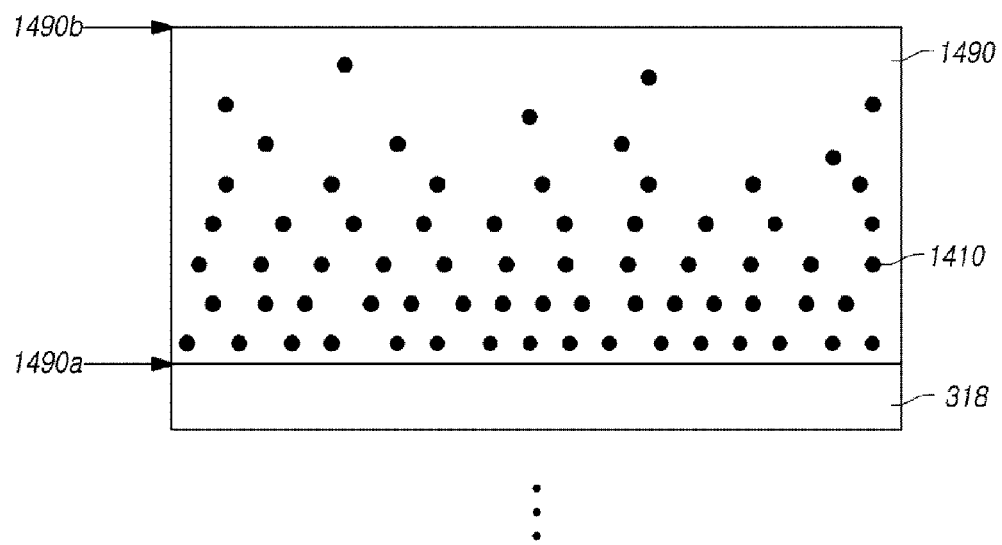
FIG. 14 is a cross-sectional view of a display panel according to a second embodiment of the present invention.

FIG. 14 is a cross-sectional view of a display panel according to the second embodiment of the present invention. For the convenience of description, the EIL to the first electrode 210 below the buffer layer 318 are not shown. In order to show the composition ratio or the distribution of the Rep_Comp, a molecule forming the Rep_Comp is shown as a reference numeral 1410. In the second electrode 1490, the composition ratio of the Rep_Comp 1410 is high in an area of an interface 1490a making contact with the buffer layer 318, and the composition ratio of the Rep_Comp 1410 is low in an area of an interface 1490b spaced apart from and far from the buffer layer 318. Therefore, a high resistance film is formed in the area close to the buffer layer 318 and thus a function of the compensation layer is provided to the area close to the buffer layer 318, and a low resistance film is formed in the area far from the buffer layer 318, and thus a function of the electrode layer is provided to the area far from the buffer layer 318. Accordingly, an the electrical conductivity of an electrode increases in the low resistance film and a function for compensating a foreign body increases in the high resistance film. More specifically, the composition of the compensation material at the first interface 1490a close to the organic light emitting layer is different from the composition of the compensation material at the second interface 1490b which is opposite to the first interface 1490a. As described with reference to FIG. 10, a case in which the composition ratio of the compensation material 1010 is different in random interfaces 910 and 920 also reflects the embodiment of FIG. 14.

Figure 15:
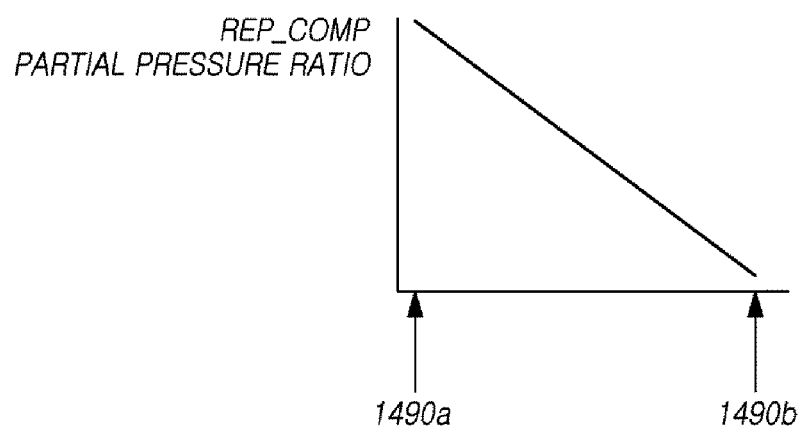
FIGS. 15 to 17 are graphs illustrating a composition ratio of an Rep_Comp in a configuration of FIG. 14.
Figure 16:
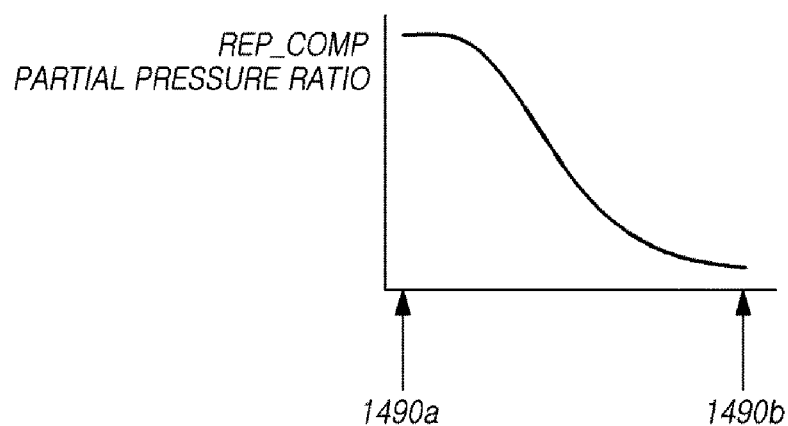
Figure 17:
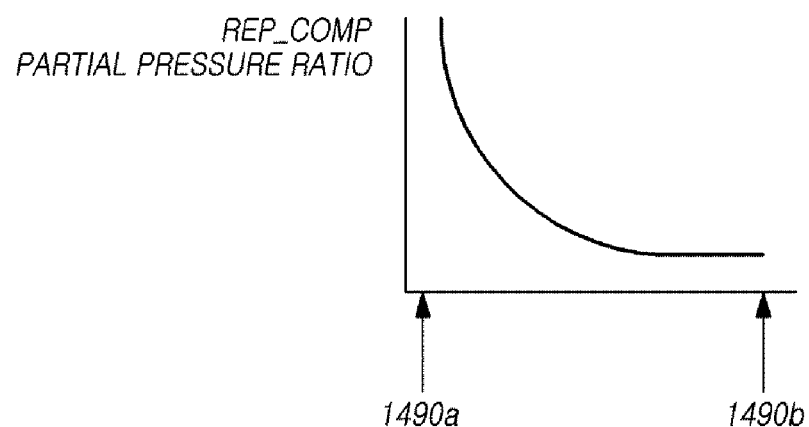

FIGS. 15 to 17 are graphs illustrating the composition ratio of the Rep_Comp in the configuration of FIG. 14. The composition ratio of the Rep_Comp between two interfaces 1490a and 1490b of the second electrode formed by gradually controlling the partial pressure ratio of the Rep_Comp in the sputtering is illustrated.

As a third embodiment of the present invention, the compensation layer may be formed using at least two types of Rep_Comp materials. For example, the compensation layer may be formed using Rep_Comp1 and Rep_Comp2 to increase a performance of a foreign body compensation. The Rep_Comp1 may be deposited together with the Cath_Comp to form the high resistance film. The Rep_Comp2 may be deposited together with the Cath_Comp to form the low resistance film of which a resistance is lower than that of the Rep_Comp1.

FIG. 18 is a cross-sectional view of a display panel according to the third embodiment of the present invention. A reference numeral 1801 is an embodiment in which two types of compensation materials form a second electrode 1800a including two layers of compensation layers 1881 and 1882 and the electrode layer 490. The Rep_Comp1 forms a resistance film of which a resistance is higher than that of the Rep_Comp2. A reference numeral 1802 is an embodiment in which three types of compensation materials form a second electrode 1800b including three layers of compensation layers 1883, 1884 and 1885 and the electrode layer 490. The Rep_Comp3 forms a resistance film of which a resistance is higher than that of the Rep_Comp4. The Rep_Comp4 forms a resistance film of which a resistance is higher than that of the Rep_Comp5. As described above, the compensation material may be included in the electrode layer 490 in a very low ratio compared to the compensation layer.

Figure 19:
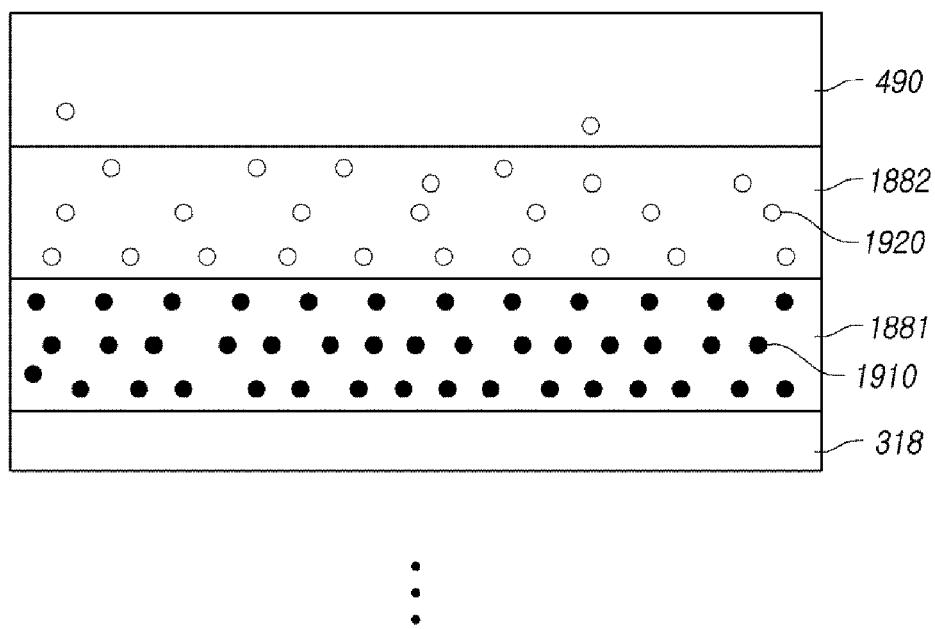
FIG. 19 is a view illustrating the distribution of a compensation material of a second electrode and a compensation layer including two types of materials according to the third embodiment of the present invention.

FIG. 19 is a view illustrating a distribution of the compensation material of the second electrode and the compensation layer including two types of materials according to the third embodiment of the present invention. The Rep_Comp1 forming the first compensation layer 1881 of the reference numeral 1801 of FIG. 18 is marked as a reference numeral 1910, and the Rep_Comp2 forming the second compensation layer 1882 of the reference numeral 1801 of FIG. 18 is marked as a reference numeral 1920. The first compensation layer 1881 forms a high resistance film. The second compensation layer 1882 forms a resistance film of which a resistance is lower than that of the high resistance film. The electrode layer 490 forms a low resistance film of which a resistance is lower than that of the resistance film formed by the second compensation layer 1882. A small amount of Rep_Comp2 may be included in the electrode layer 490. The high resistance film is formed in the area close to the buffer layer 318 and thus a function of the compensation layer is provided to the area close to the buffer layer 318, and the low resistance film is formed in the area far from the buffer layer 318, and thus a function of the electrode layer is provided to the area far from the buffer layer 318. Accordingly, the electrical conductivity of an electrode is increased in the low resistance film and a function for compensating a foreign body is increased in the high resistance film. More specifically, the composition of the compensation material in the first compensation layer 1881 at the first interface close to the organic light emitting layer is different from the composition of the compensation material in the second compensation layer 1882 at the second interface which is opposite to the first interface.

Meanwhile, when the second electrode including the compensation layer is formed according to the above-mentioned embodiment, transmittance is decreased according to the thickness of the compensation layer and thus performance of the organic light emitting display device is deteriorated. That is, since transmittance is decreased as the thickness of the high resistance film formed in the second electrode is increased to improve a performance of compensation for a foreign body, the thickness of the high resistance film may be decreased. However, this causes deterioration in the effect of preventing a foreign body from entering.

Thus, in order to the solve the problem of decreased transmittance when a single compensation layer is formed, the present invention is to provide an organic light emitting display device in which double thin compensation layers are formed in both surfaces of an organic light emitting layer and thus decrease of transmittance as well as entrance of a foreign body can be prevented.

Figure 20:
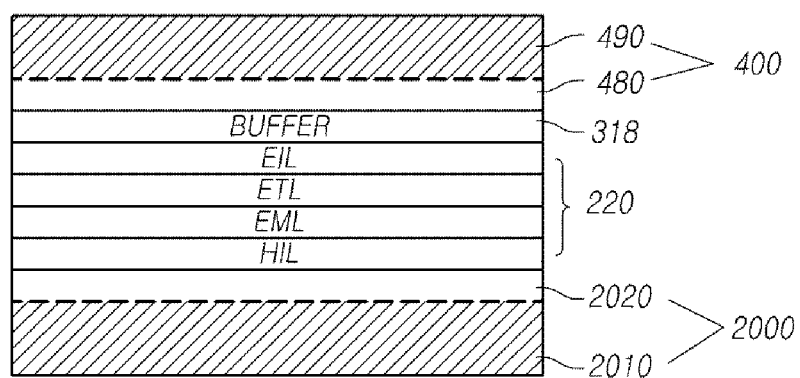
FIGS. 20 to 22 are views illustrating a cross-section of a display panel in which a first electrode including a foreign body compensation layer, according to another embodiment of the present invention, is positioned.
Figure 21:
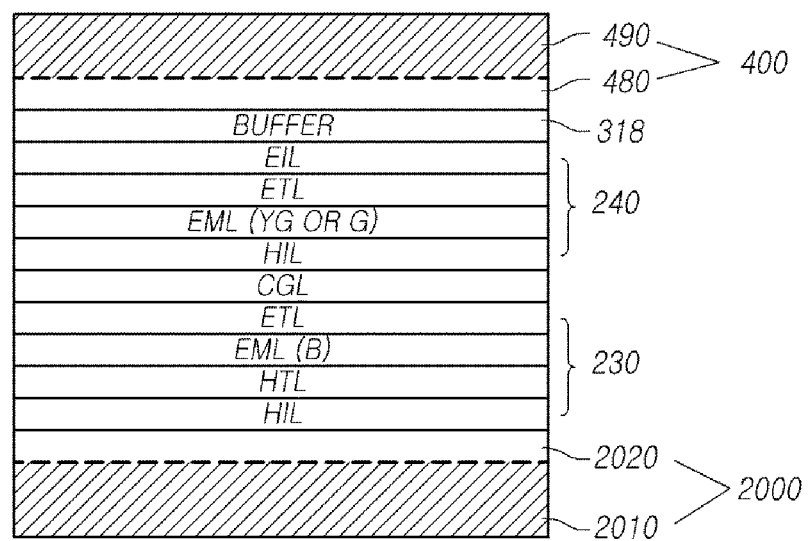
Figure 22:
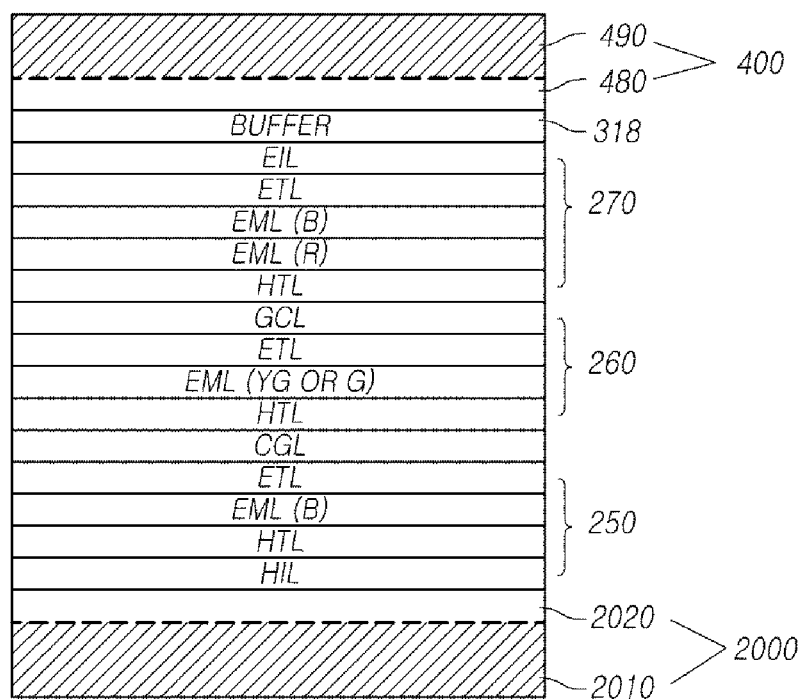

FIGS. 20 to 22 are views illustrating a cross-section of a display panel in which thin foreign body compensation layers are formed on both surfaces of the organic light emitting layer according to another embodiment of the present invention, and illustrating a cross-section of the display panel in which a second electrode including a foreign body compensation layer and a first electrode including a foreign body compensation layer are positioned. A configuration of FIG. 20 is applied to the configuration 201 of FIG. 2, a configuration of FIG. 21 is applied to a configuration 202 of FIG. 2, and a configuration of FIG. 22 is applied to a configuration 203 of FIG. 2.

In FIGS. 20 to 22, a first electrode 2000, a second electrode 400, and an organic light emitting layer disposed between the first electrode 2000 and the second electrode 400 are illustrated. The second electrode 400 is divided into a electrode layer 490 and a compensation layer 480. FIGS. 20 to 22 illustrate an example in which the number of the organic light emitting layers is one, two, or three, but the present is not limited thereto.

In FIGS. 20 to 22, the first electrode 2000 is divided into a electrode layer 2010 and a compensation layer 2020. The electrode layer 2010 and the compensation layer 2020 of the first electrode 2000 are distinguished from each other based on the composition ratio of a compensation material forming each layer thereof. That is, the electrode layer 2010 and the compensation layer 2020 is distinguished by a clear interface in the first electrode 2000. However, the first electrode 2000 includes a high resistance area and a low resistance area, the high resistance area in which the distribution of the compensation material is high serving as the compensation layer 2020 compensating for a foreign body, and the low resistance area in which the distribution of the compensation material is low serving as the electrode layer 2010 to which a power is applied.

In FIGS. 20 to 22, the compensation layer 2020 of the first electrode 2000 is formed by controlling an injection amount of a compensation gas in a process of forming the first electrode 2000. For example, when a material forming the first electrode 2000 is sputtered, a material (hereinafter, indicated as "An_Comp") forming the electrode layer 2010 is initially injected and then an injection amount of Rep_Comp which is a compensation material is increased gradually. As a result, an area adjacent to the organic light emitting layer is formed as the compensation layer 2020 of a high resistance area.

Al, Ag, ITO, and the like is used as the An_Comp which is an electrode material of the first electrode 2000, but the An_Comp is not limited thereto. The first electrode 2000 may be formed to have two or more layers, and includes a reflection electrode layer.

The compensation material, which forms the compensation layer 2020 of the first electrode 2000, is $O_2$, $O_3$, $CO_2$, $CH_4$, $CH_4O$, $CCl_4$, NO, $N_2$, $H_2S$, or the like which have a high resistance characteristic by combining with a conductive material, but is not limited thereto. The compensation material which forms the compensation layer 2020 of the first electrode 2000 may be equal to or different from a compensation material which forms the compensation layer 480 of the second electrode 400. When the compensation material of the first electrode 2000 is the same material as the compensation material of the second electrode 400, there is provided an advantage that the same material can be used in the sputtering process for forming the first electrode 2000 and the second electrode 400.

Thus, according to another embodiment of the present invention, the compensation layer 2020 is formed on the first electrode 2000 by forming two or more layers having a composition ratio different from each other and thus a function of compensating for a foreign body can be served while the compensation layer 480 of the second electrode 400 is thinned.

Hereinafter, an embodiment of the first electrode 2000 in which the compensation layer 2020 is formed will be specifically described with reference to FIGS. 23 to 25. For the convenience of description, a buffer layer 318 to a first electrode 400 positioned on the organic light emitting layer 220 are not shown.

Figure 23:
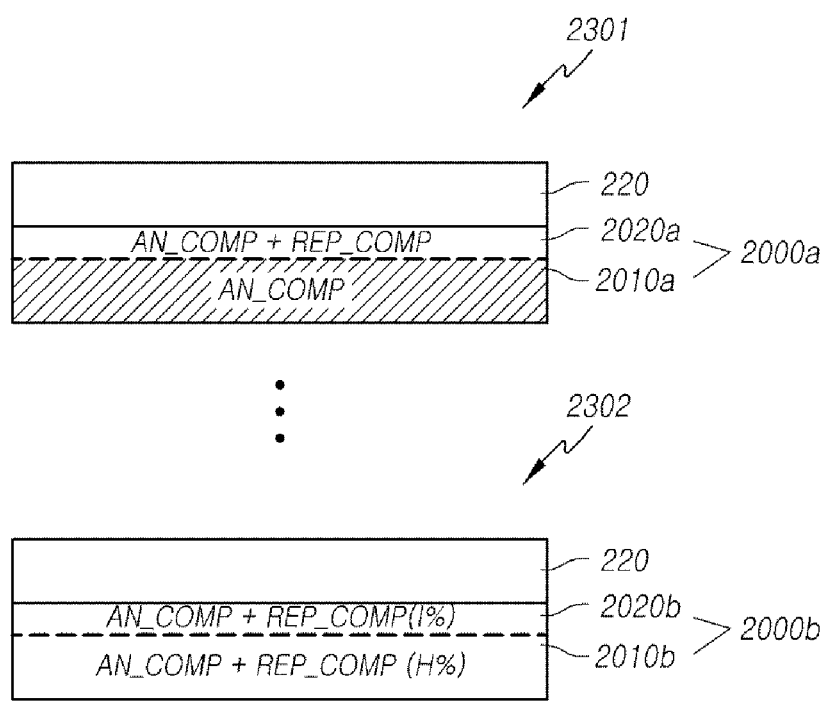
FIGS. 23 to 27 are cross-sectional views of a display panel, each view specifically illustrating an embodiment of a first electrode including a foreign body compensation layer.

FIG. 23 illustrates a configuration 2301 in which a compensation material is not included in the electrode layer 2010, and a configuration 2302 in which composition ratios of compensation materials of the compensation layer and the electrode layer are different from each other.

In FIG. 23, the An_Comp is deposited in a sputtering manner in the process of forming a first electrode 2000a or 2000b. That is, while the An_Comp is sputtered, the electrode layer 2010a or 2010b is formed and the compensation layer 2020a or 2020b is formed after increasing the partial pressure ratio of the Rep_Comp.

The Rep_Comp is not included in the electrode layer 2010, but the Rep_Comp may be partially included in the electrode layer 2010 in the course of increasing the partial pressure ratio of the Rep_Comp to form the compensation layer 2020.

Figure 24:
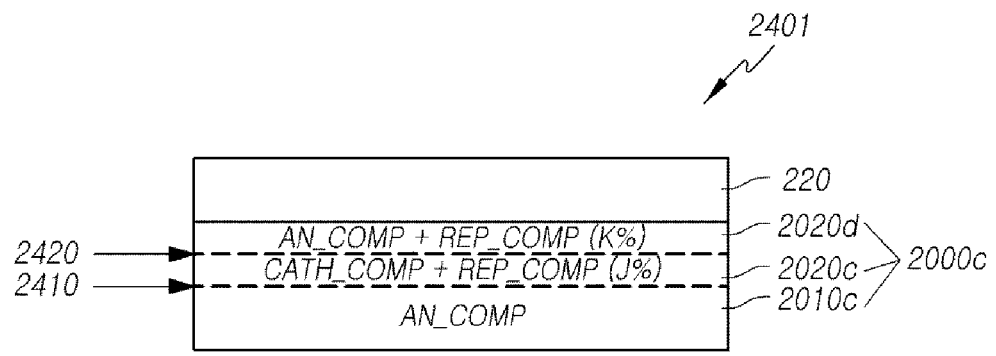

FIG. 24 illustrates a configuration in which the first electrode 2000 includes two layers of which compensation materials have composition ratios different from each other.

The An-Comp is deposited to form the electrode layer 2010c and then the partial pressure ratio of the Rep_Comp is increased to form the compensation layer 2020c and 2020d. The first compensation layer 2020c of which the Rep_Comp has a composition ratio of J % is formed by depositing the Rep_Comp in a constant partial pressure ratio, and then the second compensation layer 2020d of which the Rep_Comp has a composition ratio of K % is formed thereon by depositing the Rep_Comp with increasing the partial pressure ratio of the Rep_Comp.

In FIG. 24, the first compensation layer 2020c and the second compensation layer 2020d are formed to include the same Rep_Comp, but the partial pressure ratio is differentiated in the course of deposition such that the first compensation layer 2020c includes the Rep_Comp having the composition ratio of J % and the second compensation layer 2020d includes the Rep_Comp having the composition ratio of K %, the relation between the J and the K being K>J.

Figure 25:
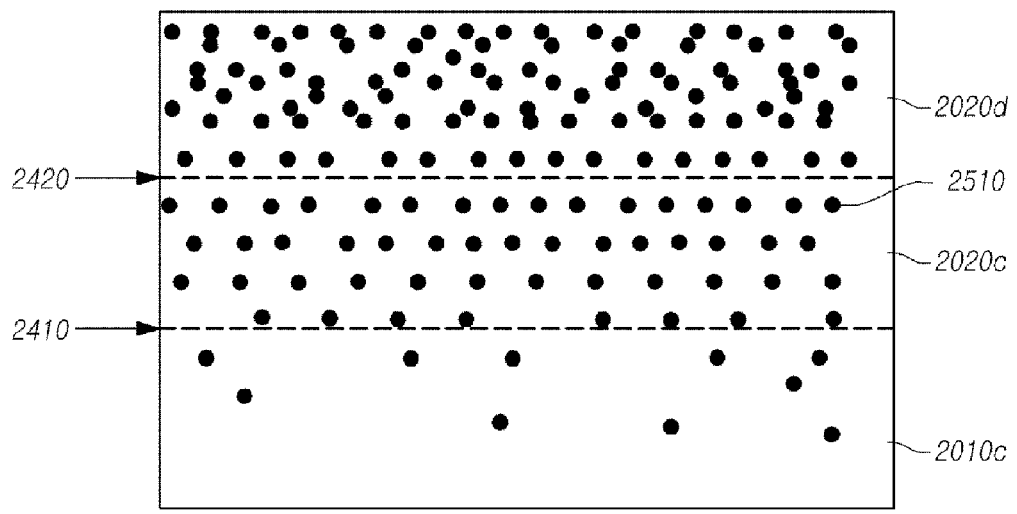

FIG. 25 illustrates the distribution of a compensation material in two interfaces 2410 and 2420 of FIG. 24 in detail.

In FIG. 25, the Rep_Comp 2510 contained in the second compensation layer 2020d has a very high composition density of K %, and the Rep_Comp 2510 contained in the first compensation layer 2020c has a relative low composition density of J % to the second compensation layer 2020d. Composition density of the Rep_Comp 2510 differentiates around the interfaces 2410 and 2420, but this differentiation is not clearly distinguished and the composition density is gradually decreased. The Rep_Comp 2510 is not contained in the electrode layer 2010c, but small amounts thereof may be contained in the course of increasing the partial pressure ratio of the Rep_Comp 2510 to form the compensation layer.

That is, according to another embodiment of the present invention, a thin compensation layer is formed on the second electrode by forming a compensation layer of compensating for a foreign body on the first electrode like the manner of forming a compensation layer of compensating for a foreign body on the second electrode. Accordingly, even though a compensation layer is formed on the second electrode, deterioration of transmittance can be prevented because of the thickness of the compensation layer.

In the above-mentioned embodiment, a case that the partial pressure ratio of one kind of a compensation material is increased step by step when the first electrode is formed is described. According to another embodiment, the compensation layer is formed by gradually increasing the partial pressure ratio of the compensation material, and the compensation layer is formed by using two or more kinds of compensation materials.

Figure 26:
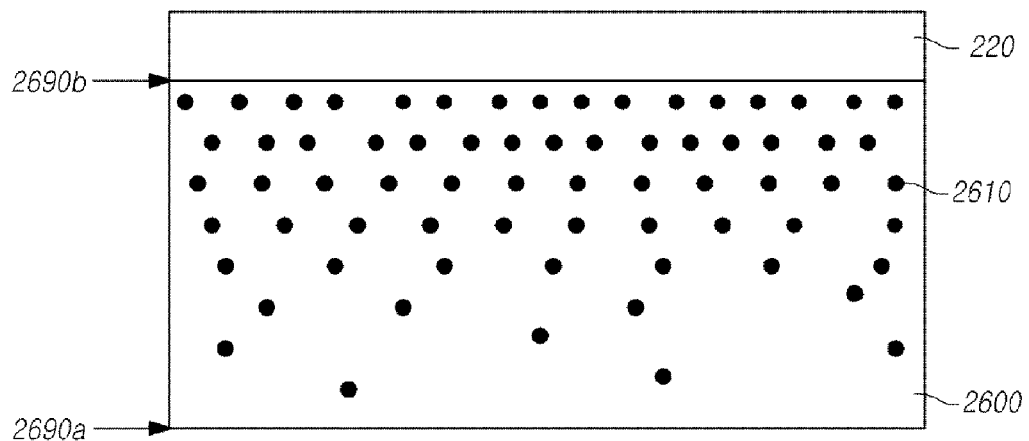

FIG. 26 is a view illustrating a case that a partial pressure ratio of a compensation material is gradually increased in the course of forming the first electrode according to another embodiment.

As illustrated in FIG. 26, when the compensation material is gradually increased, the first electrode 2600 in which the compensation material 2610 is gradually increased from an interface 2690a far disposed from an organic light emitting layer 220 to an interface 2690b adjacent to the organic light emitting layer 220 is formed. Thus, a high resistance film is formed in the area adjacent to the organic light emitting layer 220 to serve as a compensation layer, and a low resistance film is formed in the area far disposed from the organic light emitting layer 220 to serve as an electrode layer.

Figure 27:
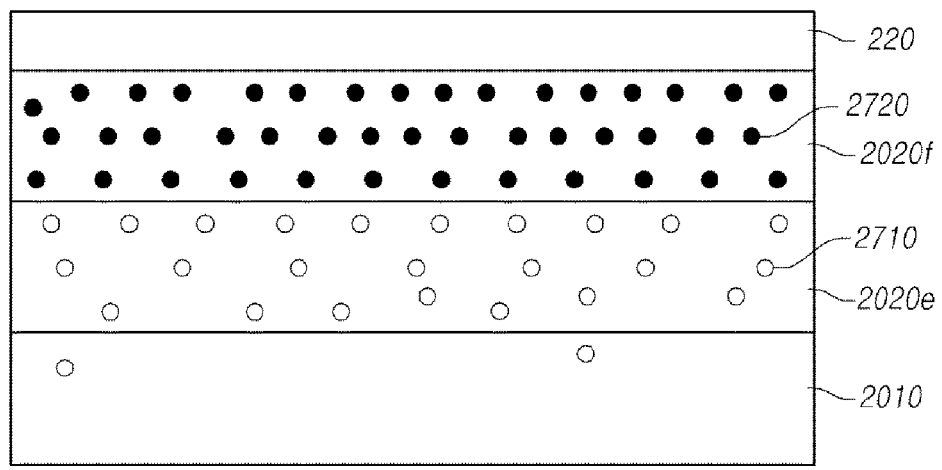

FIG. 27 illustrates a first electrode in which a compensation layer is formed by using two or more kinds of compensation materials, the first electrode being formed by using a Rep_Comp6 2710 and a Rep_Comp7 2720. The Rep_Comp7 2720 forms a higher resistance film than the Rep_Comp 6 2710.

In FIG. 27, an electrode layer 2010 is formed by sputtering the An_Comp. A first compensation layer 2020e is formed by sputtering the An_Comp and the Rep_Comp6 2710, and a second compensation layer 2020f is formed by sputtering the An_Comp and the Rep_Comp7 2720. The second compensation layer 2020f forms a high resistance film, the first compensation layer 2020e forms a lower resistance film than the second compensation layer 2020f, and the electrode layer 2010 forms a lower low resistance film than the first compensation layer 2020e. A high resistance film is formed in the area adjacent to the organic light emitting layer 220 to serve as a compensation layer, and a low resistance film is formed in the area far disposed from the organic light emitting layer 220 to serve as a electrode layer.

Thus, in another embodiment of the present invention, a compensation layer formed on an organic light emitting layer to have thin and double layers serves to prevent an entrance of a foreign body, and a first electrode and a second electrode including the compensation layer is formed in various manners. Further, a compensation layer is included in only the first electrode and thus the entrance of the foreign body is prevented and high transmittance of the second electrode is secured.

FIG. 28 is a chart illustrating a relation between the Cath_Comp which is a material forming the second electrode and the Rep_Comp which is a material sputtered to form the compensation layer. As shown in FIG. 28, the Rep_Comp that is the material forming the compensation layer may be variously selected and formed according to the Cath_Comp forming the second electrode. In addition, two or more Rep_Comps may be selected to form the compensation layer, and this is described with reference to FIGS. 18 and 19. In this case, after the material of the Rep_Comp1 which forms the high resistance film of which the resistance is comparatively high is deposited adjacently to the buffer layer, the material of the Rep_Comp2 having a resistance lower than that of the Rep_Comp1 may be deposited on the Rep_Comp1.

In addition, since a relation chart facilitating the forming of the compensation layer is formed even in a relation between the Cath_Comp that is the electrode material and the Rep_Comp that is the compensation material as shown in FIG. 28, a compensation material which may be more easily deposited according to a selection of a specific electrode material or of which a compensation function is excellent may be selected.

FIG. 29 is a chart illustrating an increase of a sheet resistance according to the partial pressure ratio of the Rep_Comp according to an embodiment of the present invention. If the partial pressure ratio increases when the Rep_Comp is $O_2$, an amount of $O_2$ included in the compensation layer of the second electrode increases. In addition, the sheet resistance increases according to the increase of $O_2$. Meanwhile, a deviation according to the thickness is not high.

Figure 30:
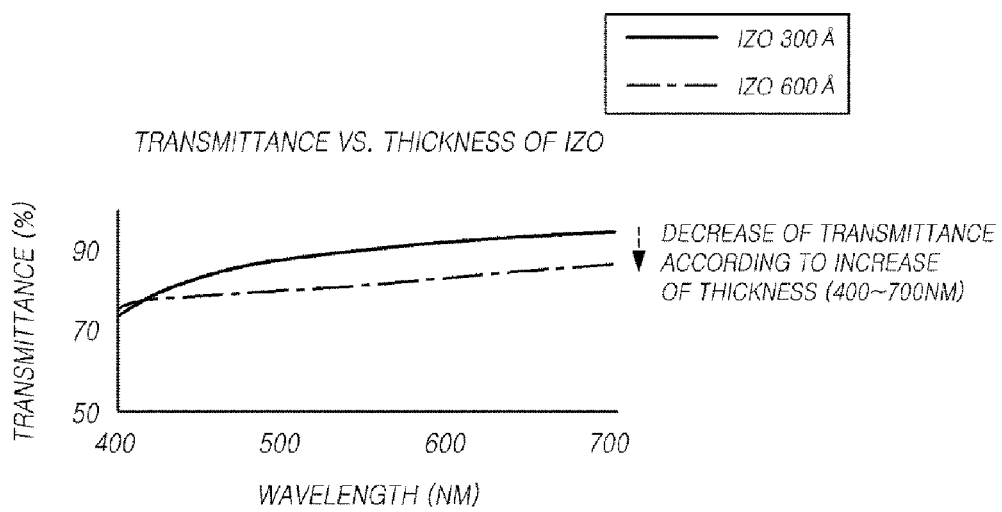
FIG. 30 is a graph illustrating a decrease of transmittance according to an increase in a thickness of a second electrode including a compensation layer.

FIG. 30 is a graph illustrating a decrease of transmittance according to an increase in a thickness of a second electrode including a compensation layer. When a second electrode including a compensation layer is formed to have a certain thickness or more in order to prevent an entrance of a foreign body, a decrease of transmittance is confirmed. The present invention provides a basic embodiment in which a single high resistance film is formed to compensate for a foreign body, but as illustrated in FIG. 30, an embodiment in which thin and double compensation layers are formed to prevent decrease of transmittance caused by increase in the thickness of the single compensation layer is also provided.

Figure 31:
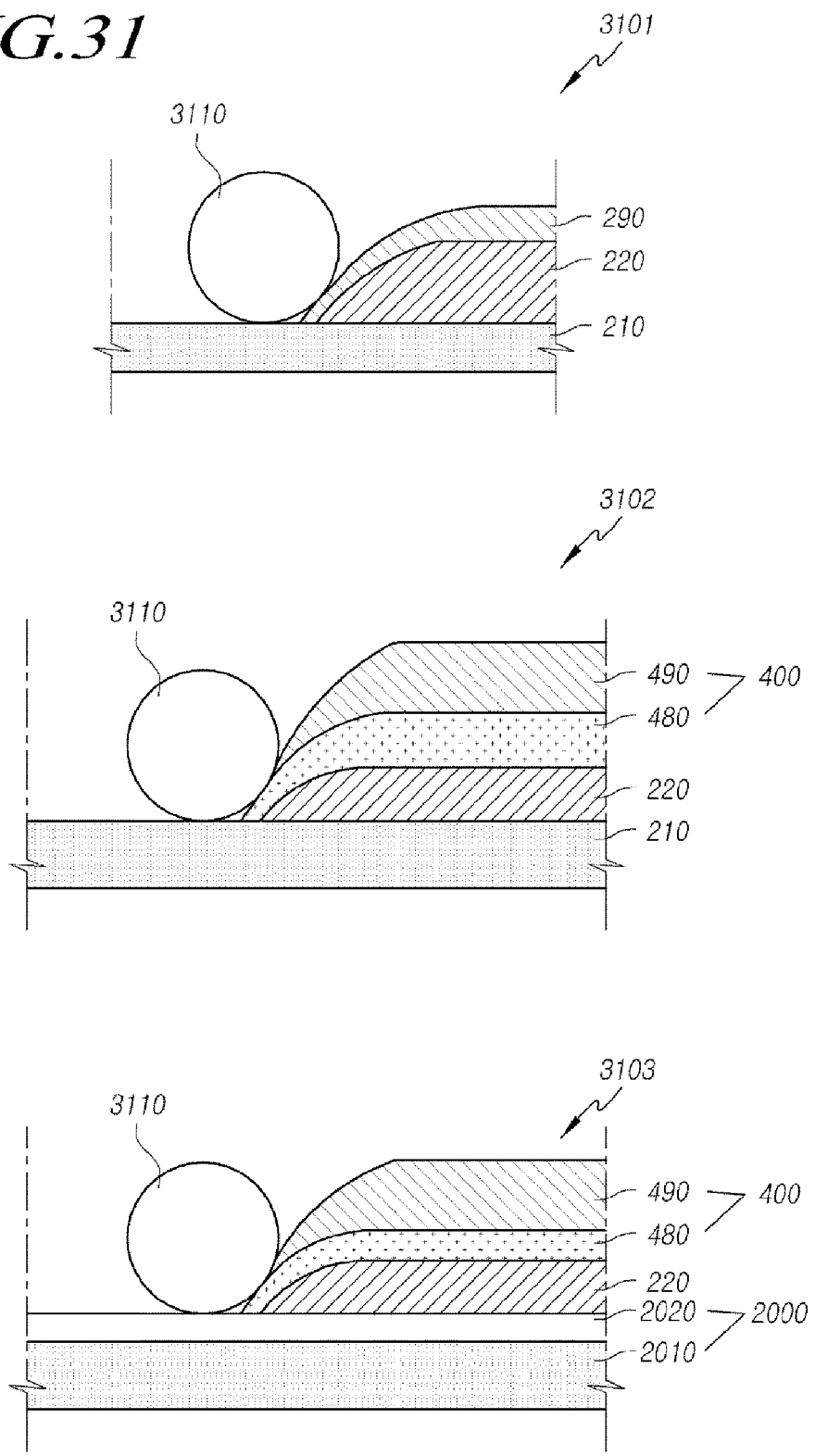
FIG. 31 is a view illustrating a comparison between the existing panel and a panel in which the foreign body compensation layer proposed in the present invention is included.

FIG. 31 is a view illustrating a comparison between the existing panel and a panel in which the foreign body compensation layer proposed in the present invention is included. In FIG. 31, a reference numeral 3110 indicates a penetrated foreign body in a panel process. In a reference numeral 3101, when a foreign body 3110 penetrates into the second electrode 290 in which a compensation layer is not included, a short between the first electrode 210 and the second electrode 290 is generated. In contrast, as shown by a reference numeral 3102, even though a foreign body 3110 penetrates into the second electrode 400 including the compensation layer 480 and the electrode layer 490, a short between the first electrode 210 and the second electrode 490 is not generated by the compensation layer 480. Thus, defect such as a dark spot is not generated. Further, like reference numeral 3103, a first electrode 2000 includes a compensation layer 2020 and an electrode layer 2010 such that thin compensation layers 480 and 2020 are formed on both surfaces of the organic light emitting layer 220. For example, each of compensation layers 480 and 2020 is formed to have a half thickness of the compensation layer 480 in a case in which a compensation layer 480 is formed in only the second electrode 400. In this case, short between the first electrode 2000 and the second electrode 400 is prevented by the compensation layers 480 and 2020 formed on both surfaces of the organic light emitting layer 220, and decrease of transmittance due to the thickness of the compensation layer 480 is prevented by forming the compensation layer 480 of the second electrode 400 to have a thin thickness.

Table 1 is a table illustrating a foreign body compensation performance according to the present invention.

TABLE 1

| Substrate | The number of dark spots | The number of dark spots generated due to the foreign body |
|---|---|---|
| Ref. 1 | 239 | 177 |
| Ref. 2 | 245 | 211 |
| Ref. 3 | 243 | 156 |

TABLE 1-continued

| Substrate | The number of dark spots | The number of dark spots generated due to the foreign body |
|---|---|---|
| Include a foreign body compensation layer | 125 | 93 |

As disclosed in Table 1, in Ref.1, Ref.2 and Ref.3 to which the present invention is not applied, an average of the number of the generated dark spots is 242.3, and among these, the number of the dark spots due to the foreign body is 181.3. However, according to the present invention, all of the number of the generated dark spots is 125, and the number of the dark spots due to the foreign body is 93. Thus, the present invention has an effect in which the number of the dark spots is reduced by a half or more.

An embodiment of the present invention provides a structure including the compensation layer preventing a short between electrodes due to a foreign body in a display panel. Specially, the foreign body compensation layer forming the high resistance film is formed in a process of depositing Transparent Conductive Oxide (TCO) such as IZO, ITO and IGZO as the second electrode. The second electrode and the foreign body compensation layer are formed in one chamber without an additional process or an additional equipment by reducing a distribution of the compensation material (i.e., the Rep_Comp) which functions as the foreign body compensation layer. Oxide film which may become a transparent cathode of an OLED, such as WO and Mo besides TCO may be applied to the second electrode, and the present invention is not limited to a specific material of the second electrode.

According to the present invention, since the high resistance film may be formed without an additional process when a foreign body or a bump exists on an electrode, a short between the first electrode (e.g., anode) and the second electrode (e.g., cathode) is prevented. Thus, the probability of dark spot generation is reduced and a panel yield is increased. In the present specification, the second electrode and the high resistance film may be formed in the same process or at the same time, by controlling a distribution ratio of the compensation material forming the high resistance film in a process of forming the second electrode which is transparent. The above-mentioned controlling of the distribution ratio of the compensation material may include a method of gradually reducing the distribution ratio of the compensation material, a method of forming the distribution of the compensation material discretely such that the foreign body compensation layer is clearly distinguished from the second electrode, and the like. In addition, the high resistance film of the foreign body compensation layer, a resistance film having about medium resistance, and the second electrode may be formed using two or more foreign body compensation materials.

When the second electrode is sputtered on a panel, since the compensation material is partially pressed and is deposited on the panel according to a predetermined partial pressure ratio before the compensation material is sputtered in the second electrode or in a process of the sputtering, a foreign body compensation structure may be included in the panel without additional and separate process and equipment.

The above description and the accompanying drawings provide an example of the technical idea of the present invention for illustrative purposes only. Those having ordinary knowledge in the technical field, to which the present invention pertains, will appreciate that various modifications and changes in form, such as combination, separation, substitution, and change of a configuration, are possible without departing from the essential features of the present invention. Accordingly, the embodiments disclosed in the present invention are merely to not limit but describe the technical spirit of the present invention. Further, the scope of the technical spirit of the present invention is limited by the embodiments. The scope of the present invention shall be construed on the basis of the accompanying claims in such a manner that all of the technical ideas included within the scope equivalent to the claims belong to the present invention.

What is claimed is:

1. An organic light emitting display device comprising:
   a substrate;
   a first electrode on the substrate, the first electrode including at least two layers of different composition of first compensation materials that increase electrical resistance of the first electrode;
   an organic light emitting layer on the first electrode; and
   a second electrode on the organic light emitting layer, the second electrode including at least two layers of differing composition of second compensation materials that increase electrical resistance of the second electrode.

2. The organic light emitting display device of claim 1, wherein the second electrode comprises a compensation layer and an electrode layer sequentially positioned from the organic light emitting layer, and
   a composition of the second compensation materials included in the compensation layer is larger than that of the second compensation materials included in the electrode layer.

3. The organic light emitting display device of claim 1, wherein the organic light emitting layer comprises:
   a first light emitting layer on the first electrode;
   a transport layer on the first light emitting layer;
   a second light emitting layer on the transport layer, and
   light emitted from the first and second light emitting layers combined with each other corresponds to white light.

4. An organic light emitting display device comprising:
   a substrate;
   a first electrode on the substrate, wherein the first electrode comprises a first compensation layer, a second compensation layer, and an electrode layer sequentially from the organic light emitting layer, and wherein a first compensation material in the first compensation layer that increases electrical resistance of the first electrode and a second compensation material in the second compensation layer that increases electrical resistance of the first electrode are different;
   an organic emitting layer on the first electrode; and
   a second electrode on the organic emitting layer.

5. The organic light emitting display device of claim 1, wherein the first compensation materials or the second compensation materials is any of $O_2$, $O_3$, $CO_2$, $CH_4$, $CH_4O$, $CCl_4$, NO, $N_2$, or $H_2S$.

6. The organic light emitting display device of claim 1, wherein the first electrode includes an electrode layer and a compensation layer sequentially positioned from the substrate, a composition of the first compensation materials of the compensation layer being larger than that of the first compensation materials of the electrode layer.

7. The organic light emitting display device of claim 1, wherein the first electrode includes an electrode layer, a first compensation layer, and a second compensation layer sequentially positioned from the substrate, wherein the first compensation materials comprise a first material included in the first compensation layer and a second material included in the second compensation layer different from the first material.

8. The organic light emitting display device of claim 1, wherein the first electrode includes a first compensation layer and a second compensation layer sequentially positioned from the substrate, a first compensation material included in the first compensation layer equal to the first compensation material included in the second compensation layer.

9. The organic light emitting display device of claim 1, wherein the first electrode includes a first interface being near the organic light emitting layer and a second interface farther away from the organic light emitting layer than the first interface, the first compensation materials of the first interface and the second interface having compositions different from each other.

10. An organic light emitting display device comprising:
    a substrate;
    a first electrode on the substrate, the first electrode including at least two layers of different composition of first compensation materials that increase electrical resistance of the first electrode;
    an organic light emitting layer on the first electrode; and
    a second electrode of which compositions of second compensation materials that increase electrical resistance of the second electrode are different at a first interface close to the organic light emitting layer and at a second interface farther away from the organic light emitting layer than the first interface.

11. The organic light emitting display device of claim 10, wherein a composition of the second compensation materials in the second electrode is highest at the first interface and the composition of the second compensation materials in the second electrode is lowest at the second interface.

12. The organic light emitting display device of claim 10, wherein the second compensation materials comprise a first material and a second material different form the first material, a composition of the first material highest at the first interface, a composition of the second material highest at an area between the first interface and the second interface, and a composition of the first material and the second material lowest at the second interface.

13. The organic light emitting display device of claim 10, wherein an electrode material forming the second electrode is $SnO_2$, and the second compensation materials include one of $O_2$, $O_3$, $CO_2$, and $CH_4$.

14. The organic light emitting display device of claim 10, wherein an electrode material forming the second electrode is ITO and the second compensation materials include one of $CH_4O$, $CCl_4$, and NO.

15. The organic light emitting display device of claim 10, wherein an electrode material forming the first electrode is IZO and the second compensation materials includes one of $O_2$, $O_3$, $N_2$, and $H_2S$.

16. The organic light emitting display device of claim 10, wherein the first electrode includes an electrode layer and a compensation layer sequentially positioned from the substrate, a composition of the first compensation materials of the compensation layer being larger than that of the first compensation materials of the electrode layer.

17. An organic light emitting display device comprising:
a substrate;
a first electrode on the substrate of which compositions of compensation materials that increase electrical resistance of the first electrode are different at a first interface close to the organic light emitting layer and at a second interface farther from the organic light emitting layer than the first interface,
wherein the compensation materials comprise a first compensation material and a second compensation material different from the first compensation material, a composition of the first compensation material highest at the first interface, a composition of the second compensation material highest at an area between the first interface and a second interface, and a composition of the first compensation material and the second compensation material is lowest at the second interface;
an organic light emitting layer on the first electrode; and
a second electrode on the organic light emitting layer.

18. The organic light emitting display device of claim 1, wherein the first compensation materials of the first electrode are different from the second compensation materials of the second electrode.

19. The organic light emitting display device of claim 10, wherein the first compensation materials of the first electrode are different from the second compensation materials of the second electrode.

* * * * *